(12) United States Patent
Yoo et al.

(10) Patent No.: US 10,804,265 B2
(45) Date of Patent: Oct. 13, 2020

(54) SEMICONDUCTOR DEVICE AND METHOD FOR FABRICATING THE SAME

(71) Applicant: Samsung Electronics Co., Ltd., Suwon-si (KR)

(72) Inventors: Sang Min Yoo, Suwon-si (KR); Ju Youn Kim, Suwon-si (KR); Hyung Joo Na, Seoul (KR); Bong Seok Suh, Seoul (KR); Joo Ho Jung, Suwon-si (KR); Eui Chul Hwang, Seoul (KR); Sung Moon Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/382,382

(22) Filed: Apr. 12, 2019

(65) Prior Publication Data

US 2020/0043920 A1 Feb. 6, 2020

(30) Foreign Application Priority Data

Aug. 3, 2018 (KR) .......................... 10-2018-0090608

(51) Int. Cl.
*H01L 27/088* (2006.01)
*H01L 29/40* (2006.01)
*H01L 21/762* (2006.01)
*H01L 29/78* (2006.01)

(52) U.S. Cl.
CPC .... *H01L 27/0886* (2013.01); *H01L 21/76224* (2013.01); *H01L 29/408* (2013.01); *H01L 29/7846* (2013.01)

(58) Field of Classification Search
CPC ... H01L 33/486; H01L 33/502; H01L 33/505; H01L 33/507; H01L 33/54; H01L 33/56; H01L 2933/0041; H01L 2933/005
See application file for complete search history.

(56) References Cited

U.S. PATENT DOCUMENTS

| | | | |
|---|---|---|---|
| 9,412,616 B1 | 8/2016 | Xie et al. | |
| 9,780,200 B2 | 10/2017 | Zhu | |
| 9,887,210 B2 | 2/2018 | Song et al. | |
| 9,905,468 B2 | 2/2018 | Kim et al. | |
| 9,923,078 B2* | 3/2018 | Greene | H01L 29/665 |
| 2017/0092767 A1* | 3/2017 | Park | H01L 29/165 |
| 2017/0365674 A1 | 12/2017 | Lee et al. | |
| 2018/0006035 A1 | 1/2018 | Yuan et al. | |
| 2018/0047636 A1 | 2/2018 | You et al. | |
| 2018/0083036 A1 | 3/2018 | Agarwal et al. | |

* cited by examiner

*Primary Examiner* — Zandra V Smith
*Assistant Examiner* — Andre C Stevenson
(74) *Attorney, Agent, or Firm* — Muir Patent Law, PLLC

(57) ABSTRACT

A semiconductor device includes a first active pattern extending lengthwise along a first direction and a second active pattern extending lengthwise along the first direction and spaced apart from the first active pattern in the first direction. The device also includes a field insulating film between the first active pattern and the second active pattern. An upper surface of the field insulating film is lower than or coplanar with upper surfaces of the first and second active patterns. The device further includes an element isolation structure in an isolation trench in the first active pattern and the field insulating film. An upper surface of the element isolation structure is higher than the upper surfaces of the first and second active patterns.

20 Claims, 30 Drawing Sheets

SEMICONDUCTOR DEVICE AND METHOD FOR FABRICATING THE SAME

This application claims priority to Korean Patent Application No. 10-2018-0090608, filed on Aug. 3, 2018, and all the benefits accruing therefrom under 35 U.S.C. § 119, the disclosure of which is incorporated herein by reference in its entirety.

BACKGROUND

1. Technical Field

The present inventive concept relates to semiconductor devices and methods for fabricating the same and, more particularly, to semiconductor devices including element isolation structures and methods for fabricating the same.

2. Description of the Related Art

A proposed scaling technique for increasing density of a semiconductor device is the use of multi-gate transistors in which a multi-channel active pattern (or a silicon body) having a fin or nanowire shape is formed on a substrate and a gate is formed on a surface of a multi-channel active pattern. Because the multi-gate transistor utilizes three-dimensional channels, is can be advantageous for scaling. Current control capability can generally be improved without increasing the gate length of the multi-gate transistor. Furthermore, such a structure can be used to effectively suppress a SCE (short channel effect) in which the potential of the channel region is affected by a drain voltage.

SUMMARY

Aspects of the present inventive concept provide semiconductor devices with improved degree of integration, reliability and performance of the element. Aspects of the present inventive concept also provide methods for fabricating semiconductor devices with an improved degree of integration, reliability and performance.

Aspects of the present inventive concept are not restricted to the embodiments set forth herein. The above and other aspects of the present inventive concept will become more apparent to one of ordinary skill in the art to which the present inventive concept pertains by referencing the detailed description of the present inventive concept given below.

According to some embodiments of the inventive concept, a semiconductor device includes a first active pattern extending lengthwise along a first direction and a second active pattern extending lengthwise along the first direction and spaced apart from the first active pattern in the first direction. The device also includes a field insulating film between the first active pattern and the second active pattern. An upper surface of the field insulating film is lower than or coplanar with upper surfaces of the first and second active patterns. The device further includes an element isolation structure in an isolation trench in the first active pattern and the field insulating film. An upper surface of the element isolation structure is higher than the upper surfaces of the first and second active patterns.

According to some embodiments of the inventive concept, a semiconductor device includes a first active pattern extending lengthwise along a first direction, a second active pattern extending lengthwise along the first direction and spaced apart from the first active pattern along the first direction, and a third active pattern extending lengthwise along the first direction and spaced apart from the first and second active patterns along a second direction. The device also includes a first field insulating film between the first active pattern and the second active pattern and having an upper surface lower than or coplanar with upper surfaces of the first and second active patterns. The device further includes an element isolation structure extending lengthwise along the second direction between the first active pattern and the first field insulating film and crossing the third active pattern.

According to some embodiments of the inventive concept, a semiconductor device includes a first active pattern extending lengthwise along a first direction and a second active pattern extending lengthwise along the first direction and spaced apart from the first active pattern in the first direction. The device also includes a field insulating film between the first active pattern and the second active pattern and having an upper surface lower than or coplanar with upper surfaces of the first and second active patterns. The device further includes an element isolation structure in an isolation trench in the first active pattern and the field insulating film and extending lengthwise along second direction intersecting the first direction. The field insulating film and the element isolation structure include different materials.

According to some embodiments of the inventive concept, a semiconductor device includes a first active pattern extending lengthwise along a first direction and a second active pattern extending lengthwise along the first direction and spaced apart from the first active pattern along the first direction. The device also includes a field insulating film between the first active pattern and the second active pattern and having an upper surface lower than or coplanar with upper surfaces of the first and second active patterns. A first gate structure extends lengthwise along a second direction intersecting the first direction and crossing the first active pattern. The device further includes an element isolation structure in an isolation trench in the first active pattern and the field insulating film and extending lengthwise along the second direction. An upper surface of the first gate structure and an upper surface of the element isolation structure are substantially coplanar.

According to some method embodiments of the inventive concept, a first active pattern and a second active pattern are formed on a substrate. Each of the first and second active patterns extend lengthwise along a first direction and are spaced apart along the first direction. A field insulating film is formed between the first active pattern and the second active pattern. An upper surface of the field insulating film is lower than or coplanar with upper surfaces of the first and second active patterns. A first isolation trench is formed extending lengthwise along a second direction intersecting the first direction in the first active pattern and the field insulating film. An element isolation structure is formed in the first isolation trench. An upper surface of the element isolation structure is higher than the upper surfaces of the first and second active patterns.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION

Figure 1:
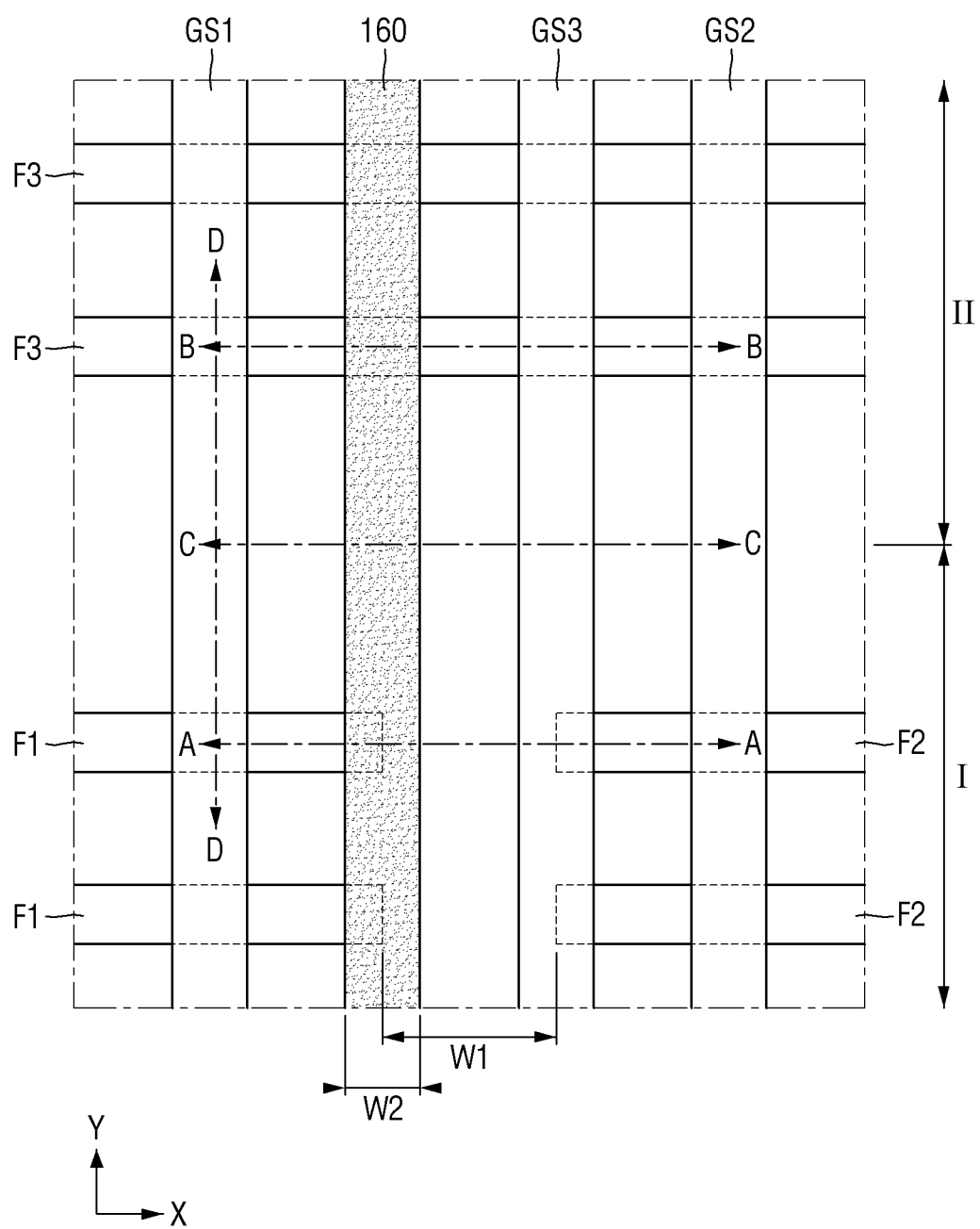
FIG. 1 is a schematic layout diagram for explaining a semiconductor device according to some embodiments of the present inventive concept.

Hereinafter, a semiconductor device according to some embodiments of the present inventive concept will be described with reference to FIGS. 1 to 21.

In the drawings of the semiconductor device according to some embodiments of the present inventive concept, a fin transistor (FinFET) including a channel region of a fin pattern shape is exemplarily illustrated, but is not limited thereto. The semiconductor device according to some embodiments of the present inventive concept may, of course, include a tunneling transistor (FET), a transistor including a nanowire, a transistor including a nanosheet, or a three-dimensional (3D) transistor. Furthermore, the semiconductor device according to some embodiments of the present inventive concept may include a bipolar junction transistor, a lateral double diffused transistor (LDMOS), or the like.

Figure 2:
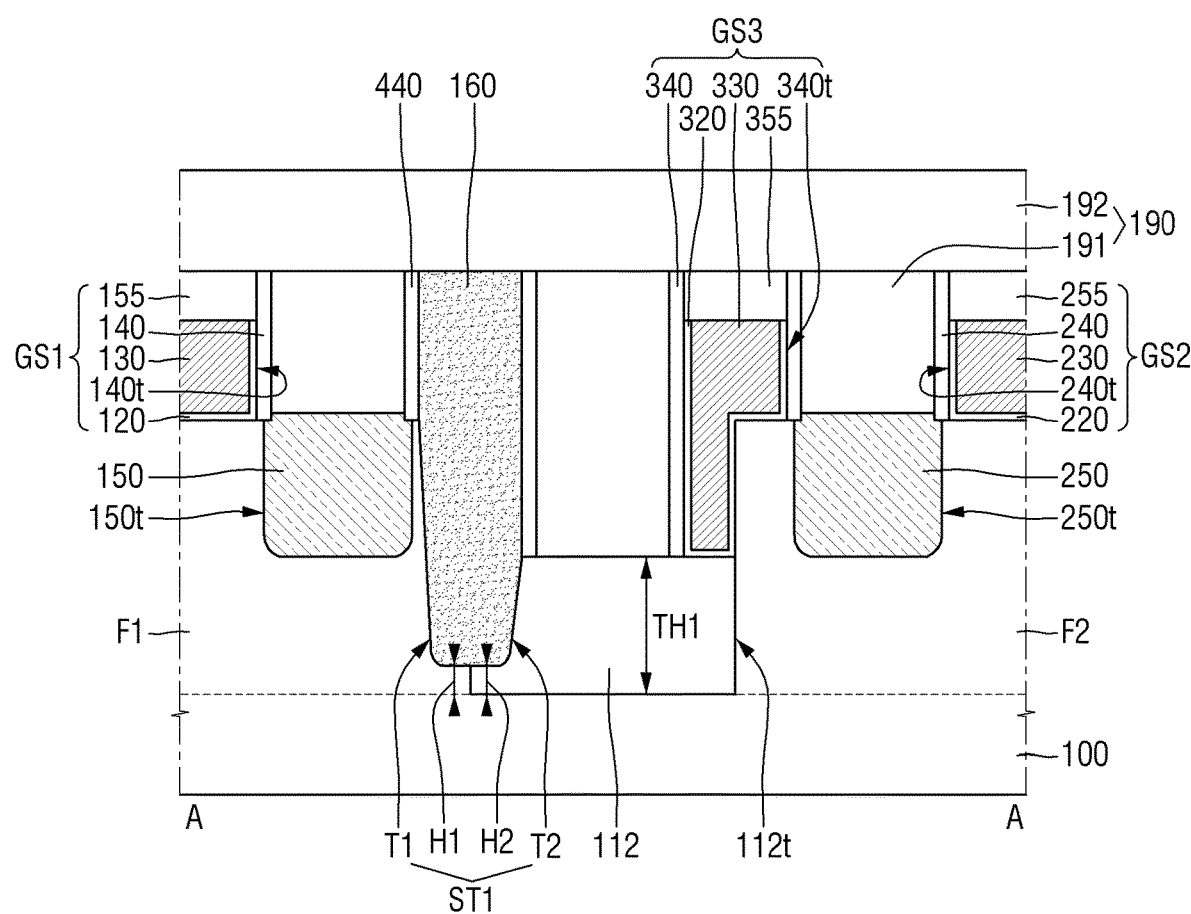
FIG. 2 is a cross-sectional view taken along the line A-A in FIG. 1.
Figure 3:
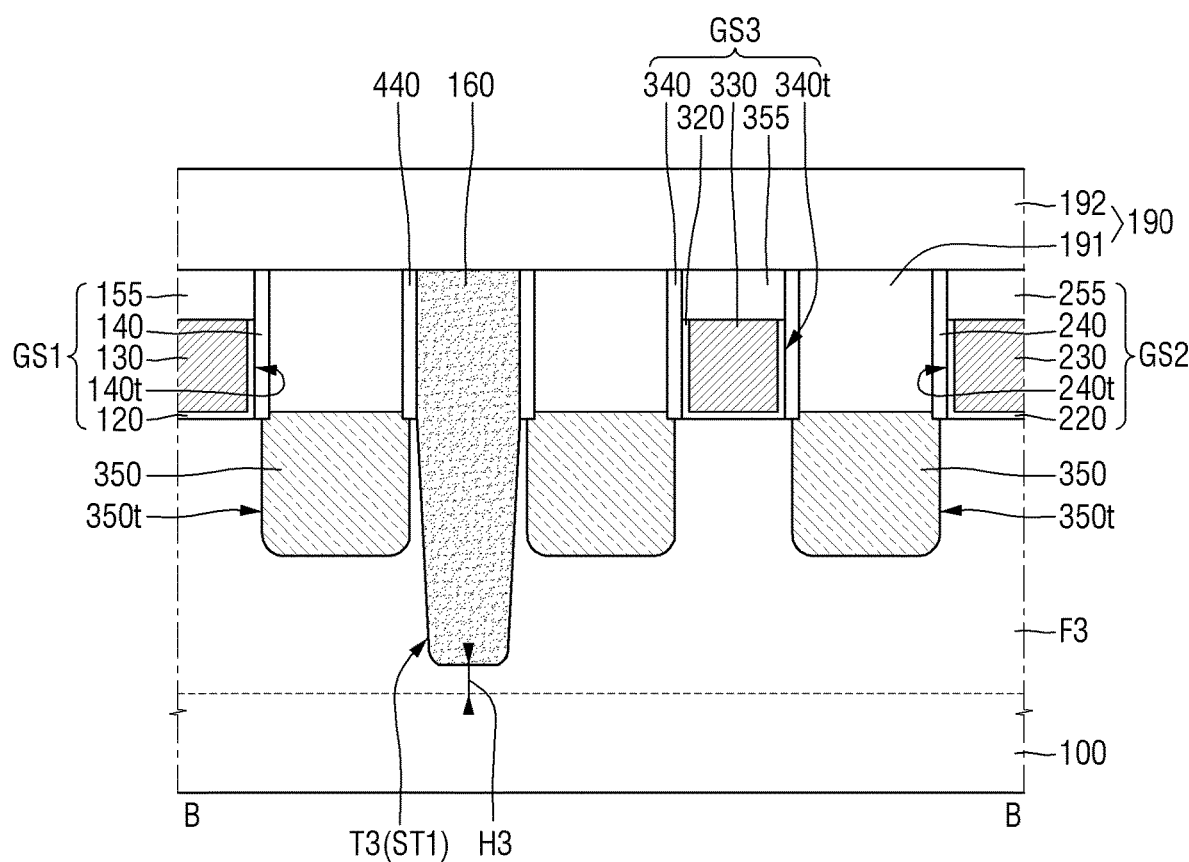
FIG. 3 is a cross-sectional view taken along the line B-B of FIG. 1.
Figure 4:
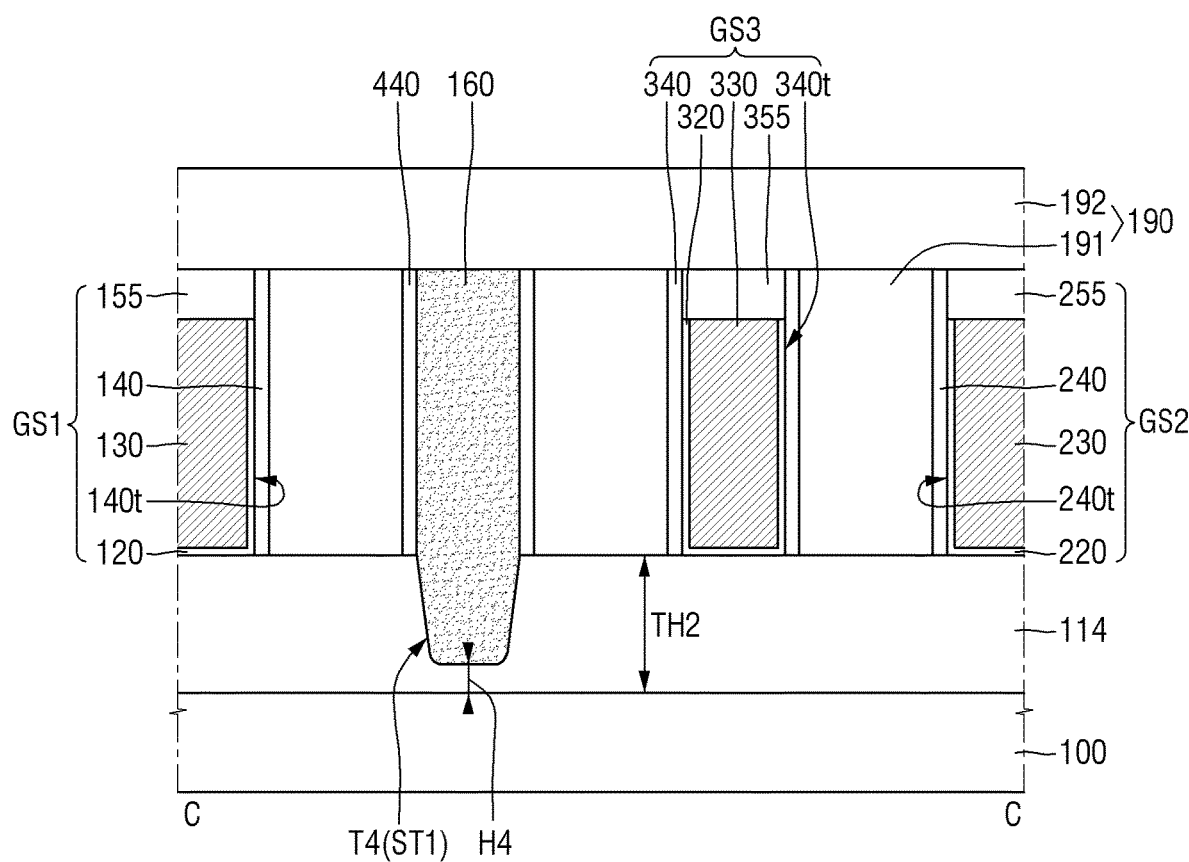
FIG. 4 is a cross-sectional view taken along the line C-C of FIG. 1.
Figure 5:
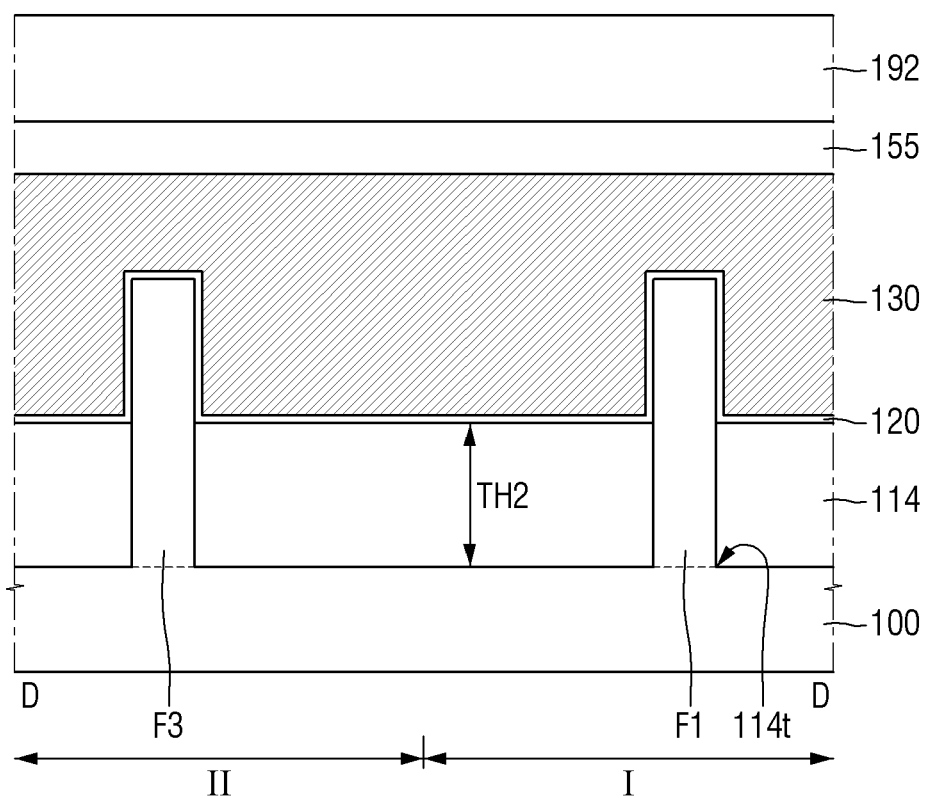
FIG. 5 is a cross-sectional view taken along the line D-D of FIG. 1.

FIG. 1 is a schematic layout diagram for explaining a semiconductor device according to some embodiments of the present inventive concept. FIG. 2 is a cross-sectional view taken along the line A-A in FIG. 1. FIG. 3 is a cross-sectional view taken along the line B-B of FIG. 1. FIG. 4 is a cross-sectional view taken along the line C-C of FIG. 1. FIG. 5 is a cross-sectional view taken along the line D-D of FIG. 1.

Referring to FIGS. 1 to 5, the semiconductor device according to some embodiments includes a substrate 100, first to third active patterns F1, F2 and F3, a first field insulating film 112, a second field insulating film 114, first to third gate structures GS1, GS2 and GS3, an element isolation structure 160, first to third source/drain regions 150, 250 and 350, a first interlayer insulating film 191, and a second interlayer insulating film 192.

The substrate 100 may be bulk silicon or silicon-on-insulator (SOI). In some embodiments, the substrate 100 may be a silicon substrate or may include other materials, but is not limited to, for example, silicon germanium, silicon germanium on insulator (SGOI), indium antimonide, lead tellurium compound, indium arsenide, phosphide indium, gallium arsenide or gallium antimonide.

The substrate 100 may include a first region I and a second region II. In FIG. 1, although the first region I and the second region II are illustrated as regions connected to each other, embodiments are not limited thereto, and the first region I and the second region II may be regions spaced apart from each other. In the first region I and the second region II, semiconductor elements of the same conductivity type may be formed, and semiconductor elements of different conductivity types may be formed. For convenience of description, it will be described below that the first region I is an NMOS region and the second region II is a PMOS region.

Each of the first to third active patterns F1, F2 and F3 may protrude from the substrate 100. Each of the first to third active patterns F1, F2 and F3 may extend lengthwise along a first direction X on the substrate 100. For example, each of the first to third active patterns F1, F2 and F3 may include a long side extending in the first direction X, and a short side extending in a second direction Y.

The long sides of the first to third active patterns F1, F2 and F3 may be defined by a fin trench 114t. For example, as illustrated in FIG. 5, each of the long side of the first active pattern F1 and the long side of the third active pattern F3 may be defined by the fin trench 114t.

The first active pattern F1 and the second active pattern F2 may be aligned in a length direction. For example, the second active pattern F2 may be spaced apart from the first active pattern F1 in the first direction X. As a result, the short side of the first active pattern F1 and the short side of the second active pattern F2 may face each other.

The first active pattern F1 and the second active pattern F2 may be separated from each other by a fin cut trench 112t. For example, as illustrated in FIG. 2, the short sides of the first and second active patterns F1 and F2 may be defined by fin cut trench 112t, respectively.

The first active pattern F1 and the second active pattern F2 may be disposed on the first region I of the substrate 100. For example, the first active pattern F1 and the second active pattern F2 may be used as the NMOS channel region, respectively.

The third active pattern F3 may be spaced apart from the first and second active patterns F1 and F2 in the second direction Y. The second direction Y may be a direction intersecting the first direction X. In FIG. 1, the second direction Y is illustrated as being orthogonal to the first direction X, but the embodiment is not limited thereto.

The third active pattern F3 may be disposed on the second region II of the substrate 100. For example, the third active pattern F3 may be used as the PMOS channel region.

The first to third active patterns F1, F2 and F3 may be a part of the substrate 100, and may also include an epitaxial layer that is grown from the substrate 100. Each of the first to third active patterns F1, F2 and F3 may include silicon or germanium which is an elemental semiconductor material. Further, the first to third active patterns F1, F2 and F3 may include compound semiconductors, and may include, for example, Iv-Iv group compound semiconductors or III-v group compound semiconductors.

The first field insulating film 112 may be formed on the substrate 100. The first field insulating film 112 may be interposed between the first active pattern F1 and the second active pattern F2. The first field insulating film 112 may fill at least a part of the fin cut trench 112t. For example, the first field insulating film 112 may be formed on a part of the side walls of the short sides of the first and second active patterns F1 and F2.

The second field insulating film 114 may be formed on the substrate 100. The second field insulating film 114 may fill a part of the fin trench 114t. Further, for example, the second field insulating film 114 may be formed on a part of the side walls of the long sides of the first to third active patterns F1, F2 and F3. Further, for example, the second field insulating film 114 may be interposed between the first active pattern F1 and the third active pattern F3, and between the second active pattern F2 and the third active pattern F3. In some embodiments, the upper surfaces of the first to third active patterns F1, F2 and F3 may protrude upward from the upper surface of the second field insulating film 114.

In some embodiments, a thickness TH1 of the first field insulating film 112 may be substantially the same as a thickness TH2 of the second field insulating film 114. For example, the first field insulating film 112 and the second field insulating film 114 may be formed at the same level. In the present specification, "the same level" means the level formed by the same fabricating process. However, embodiments of the inventive concept are not limited thereto, and the thickness TH1 of the first field insulating film 112 and the thickness TH2 of the second field insulating film 114 may differ from each other.

For example, the first field insulating film 112 and the second field insulating film 114 may include, for example, at least one of silicon nitride, silicon oxide, silicon carbide, silicon carbonitride, silicon oxycarbide, silicon oxynitride, silicone oxycarbonitride and aluminum oxide. Although each of the first field insulating film 112 and the second field insulating film 114 is illustrated as a single film, this is only for convenience of description, and the embodiment is not limited thereto.

In some embodiments, the first field insulating film 112 may include a material that applies a tensile stress to the first active pattern F1 and/or the second active pattern F2. For example, the first field insulating film 112 may include silicon oxide.

Each of the first to third gate structures GS1, GS2 and GS3 may extend lengthwise along the second direction Y. For example, each of the first to third gate structures GS1, GS2 and GS3 may include a long side extending in the second direction Y and a short side extending in the first direction X.

The first gate structure GS1 may be formed on the first active pattern F1 and the third active pattern F3. The first gate structure GS1 may intersect with the first active pattern F1 and the third active pattern F3. Further, a part of the first gate structure GS1 may extend along the upper surface of the second field insulating film 114.

The second gate structure GS2 may be formed on the second active pattern F2 and the third active pattern F3. The second gate structure GS2 may intersect with the second active pattern F2 and the third active pattern F3. In addition, a part of the second gate structure GS2 may extend along the upper surface of the second field insulating film 114.

The third gate structure GS3 may be formed on the second active pattern F2 and the third active pattern F3. The second gate structure GS2 may intersect the second active pattern F2 and the third active pattern F3. In addition, a part of the second gate structure GS2 may extend along the upper surface of the second field insulating film 114.

In some embodiments, a part of the third gate structure GS3 may be formed on the first field insulating film 112. For example, the third gate structure GS3 may be formed over the short side of the second active pattern F2. For example, as illustrated in FIG. 2, a part of the third gate structure GS3 may extend along the upper surface of the first field insulating film 112, and the other part of the third gate structure GS3 may extend along the upper surface of the second active pattern F2.

Each of the first to third gate structures GS1, GS2 and GS3 may include gate insulating films 120, 220 and 320, gate electrodes 130, 230 and 330, gate spacers 140, 240 and 340, gate trenches 140t, 240t and 340t defined by the gate spacers 140, 240 and 340, and capping patterns 155, 255 and 355.

The first to third gate insulating films 120, 220 and 320 may be interposed between the first to third active patterns F1, F2 and F3 and the gate electrodes 130, 230 and 330. In some embodiments, each of the first to third gate insulating films 120, 220 and 320 may extend along the side walls and the bottom surfaces of the respective gate trenches 140t, 240t and 340t The first to third gate insulating films 120, 220, and 320 may include, for example, a high dielectric constant insulating film. The high dielectric constant insulating film may include a high dielectric material having a dielectric constant higher than that of the silicon oxide film. For example, the first to third gate insulating films 120, 220, and 320 may include at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

The first to third gate electrodes 130, 230 and 330 may be formed on the first to third gate insulating films 120, 220, and 320, respectively. Further, the first to third gate electrodes 130, 230 and 330 may fill at least some parts of the gate trenches 140t, 240t and 340t, respectively.

The first to third gate electrodes 130, 230 and 330 may include, for example, at least one of Ti, Ta, W, Al, Co and combinations thereof. In addition, for example, the first to third gate electrodes 130, 230, and 330 may include silicon, silicon germanium, or the like, rather than metal.

The first to third gate spacers 140, 240, and 340 may be formed on the side walls of the first to third gate electrodes 130, 230 and 330, respectively. The first to third gate spacers 140, 240, and 340 may include, for example, at least one of silicon nitride (SiN), silicon oxynitride (SiON), silicon oxide (SiO$_2$), silicon oxycarbonitride (SiOCN), and the like.

The first to third capping patterns 155, 255 and 355 may be formed on the gate electrodes 130, 230 and 330, respectively. The first to third capping patterns 155, 255 and 355 may include, for example, at least one of silicon oxide (SiO$_2$), silicon nitride (SiN), silicon oxynitride (SiON), silicon carbonitride (SiCN), silicon oxycarbonitride (SiOCN), and combinations thereof. In some embodiments, the first to third capping patterns 155, 255 and 355 may be omitted.

In some embodiments, the first to third gate spacers 140, 240 and 340 may be formed on the side walls of the first to third gate electrodes 130, 230 and 330 and on the side walls of the first to third capping patterns 155, 255 and 355, respectively. For example, as illustrated in FIGS. 2 to 4, the first gate electrode 130 may fill a part of the first gate trench 140t, and the first capping pattern 155 may fill the remaining part of the first gate trench 140t.

The element isolation structure 160 may extend lengthwise along the second direction Y. For example, the element isolation structure 160 may include a long side extending in the second direction Y, and a short side extending in the first direction X.

The element isolation structure 160 may cross between the first active pattern F1 and the first field insulating film 112. Further, the element isolation structure 160 may cross the third active pattern F3. For example, the element isolation structure 160 may fill a first isolation trench ST1 formed in the first active pattern F1, the third active pattern F3, the first field insulating film 112 and the second field insulating film 114.

The first isolation trench ST1 may extend lengthwise in the second direction Y. The first isolation trench ST1 has a first trench T1 in the first active pattern F1, a second trench T2 in the first field insulating film 112, a third trench T3 in the third active pattern F3, and a fourth trench T4 in the second field insulating film 114.

As illustrated in FIG. 2, the element isolation structure 160 which fills the first trench T1 and the second trench T2 may cross between the first active pattern F1 and the first field insulating film 112. As illustrated in FIG. 3, the element isolation structure 160 which fills the third trench T3 may cross the third active pattern F3.

The side wall of the first isolation trench ST1 may have a tapered shape. For example, the width of the first isolation trench ST1 may increase as it goes away from the upper surface of the substrate 100. This may be attributed to the characteristics of the etching process of forming the first isolation trench ST1. However, embodiments of the inventive concept are not limited thereto, and the side wall of the first isolation trench ST1 may be perpendicular to the upper surface of the substrate 100.

The bottom surface of the element isolation structure 160 may be lower than the upper surface of the first field insulating film 112 and the upper surface of the second field insulating film 114. For example, the heights H1, H2, H3, and H4 from the upper surface of the substrate 100 to the bottom surface of the first isolation trench ST1 may be smaller than the thickness TH1 of the first field insulating film 112 and the thickness TH2 of the second field insulating film 114.

In some embodiments, the height H1 from the upper surface of the substrate 100 to the bottom surface of the first trench T1 may be substantially the same as the height H3 from the upper surface of the substrate 100 to the bottom surface of the third trench T3. For example, the first active pattern F1 and the third active pattern F3 may include substantially the same material, and the height H1 of the bottom surface of the first trench T1 may be substantially the same as the height H3 of the bottom surface of the third trench T3.

In some embodiments, the height H2 from the upper surface of the substrate 100 to the bottom surface of the second trench T2 may be substantially the same as the height H4 from the upper surface of the substrate 100 to the bottom surface of the fourth trench T4. For example, the first field insulating film 112 and the second field insulating film 114 may include substantially the same material, and the height H2 of the bottom surface of the second trench T2 may be substantially the same as the height H4 of the bottom surface of the fourth trench T4.

In FIG. 2, although the height H1 of the bottom surface of the first trench T1 is illustrated as being the same as the height H2 of the bottom surface of the second trench T2, this is for convenience of explanation, and embodiments of the inventive concept are not limited thereto. For example, the height H1 of the bottom surface of the first trench T1 and the height H2 of the bottom surface of the second trench T2 may be different from each other, depending on the characteristics of the etching process of forming the first isolation trench ST1.

The upper surface of the element isolation structure 160 may be higher than the upper surfaces of the first to third active patterns F1, F2 and F3. In some embodiments, the upper surface of the element isolation structure 160 may be disposed substantially on the same plane as the upper surfaces of the first to third gate structures GS1, GS2 and GS3. In the present specification, the meaning of "the same" includes not only completely the same but also a fine difference which may occur due to a process margin or the like.

In some embodiments, a first isolation spacer 440 may be further formed on the side wall of the element isolation structure 160. The first isolation spacer 440 may extend lengthwise along the second direction Y. For example, the first separation spacer 440 on one side wall of the element isolation structure 160 may extend along the upper surface of the first active pattern F1, the upper surface of the third active pattern F3, and the upper surface of the second field insulating film 114. Further, for example, the first isolation spacer 440 on the other side wall of the element isolation structure 160 may extend along the upper surface of the first field insulating film 112, the upper surface of the third active pattern F3, and the upper surface of the second field insulating film 114.

In some embodiments, the first isolation spacer 440 may be formed at the same level as the first to third gate spacers 140, 240 and 340. For example, the first isolation spacer 440 may include substantially the same material as those of the first to third gate spacers 140, 240 and 340.

In some embodiments, a width W2 of the element isolation structure 160 may be defined by a distance between the first isolation spacers 440. For example, the width W2 of the element isolation structure 160 may be substantially the same as a distance between the third gate spacers 140. In some embodiments, the width W2 of the element isolation structure 160 may be smaller than a width W1 of the first field insulating film 112.

The element isolation structure 160 may include an insulating material. For example, the element isolation structure 160 may include, for example, at least one of silicon nitride, silicon oxide, silicon carbide, silicon carbonitride, silicon oxycarbide, silicon oxynitride, silicone oxycarbonitride and aluminum oxide. The element isolation structure 160 is illustrated as a single film, but this is only for convenience of explanation, and the embodiment is not limited thereto.

In some embodiments, the element isolation structure 160 may include a material different from the first field insulating film 112. For example, the element isolation structure 160 may include a material that applies a compressive stress to the first active pattern F1 and/or the third active pattern F3. For example, the element isolation structure 160 may include silicon nitride.

The first to third source/drain regions 150, 250 and 350 may be formed in the respective first to third active patterns F1, F2 and F3. For example, the first source/drain region 150 may be formed in the first active pattern F1 between the first gate structure GS1 and the element isolation structure 160, and the second source/drain region 250 may be formed in the second active pattern F2 between the second gate structure GS2 and the third gate structure GS3. For example, the third source/drain region 350 may be formed in the third active pattern F3.

Each of the first to third source/drain regions 150, 250 and 350 may include epitaxial layers formed on each of the first to third active patterns F1, F2 and F3. For example, the first source/drain region 150 may be an epitaxial pattern that fills the first source/drain trench 150t formed in the first active pattern F1, the second source/drain region 250 may be an epitaxial pattern that fills a second source/drain trench 250t formed in the second active pattern F2, and the third source/drain region 350 may be an epitaxial pattern that fills a third source/drain trench 250t formed in the third active pattern F3. However, embodiments of the inventive concept are not limited thereto. For example, the first to third source/drain regions 150, 250 and 350 may be impurity regions formed in each of the first to third active patterns F1, F2 and F3. In some embodiments, the first to third source/drain regions 150, 250 and 350 may be elevated source/drain regions that include upper surfaces protruding upward from the upper surfaces of the first to third active patterns F1, F2 and F3.

In some embodiments, the first to third source/drain regions 150, 250 and 350 may include an undercut formed on the lower ends of the first to third gate structures GS1, GS2 and GS3 and the first isolation spacer 440. This may be attributed to the characteristics of the etching process for forming the first to third source/drain trenches 150t, 250t and 350t. However, embodiments of the inventive concept are not limited thereto. For example, the first to third source/drain regions 150, 250 and 350 may not include undercut.

The first interlayer insulating film 191 may be formed on the first and second field insulating films 112 and 114 and the first to third source/drain regions 150, 250 and 350. In addition, the first interlayer insulating film 191 may cover side walls of the first to third gate structures GS1, GS2 and GS3. In some embodiments, the first interlayer insulating film 191 may include an etching prevention film extending along the upper surfaces of the first to third source/drain regions 150, 250, and 350. In some embodiments, the upper surface of the first interlayer insulating film 191 may be disposed on substantially the same plane as the upper surfaces of the respective first to third capping patterns 155, 255 and 355.

The second interlayer insulating film 192 may be formed on the first interlayer insulating film 191, the first to third gate structures GS1, GS2 and GS3, and the element isolation structure 160. Thus, the element isolation structure 160 may extend from the bottom surface of the first isolation trench ST1 to the bottom surface of the second interlayer insulating film 192. The interlayer insulating film 190 may include the first interlayer insulating film 191 and the second interlayer insulating film 192. The first interlayer insulating film 191 and the second interlayer insulating film 192 may include, for example, at least one of silicon oxide, silicon nitride, silicon oxynitride, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped Silicone Oxide), Xerogel, Aerogel, Amorphous Fluorinated Carbon, OSG (Organo Silicate Glass), Parylene, BCB (bis-benzocyclobutenes), SiLK, polyimide, porous polymeric material and combinations thereof.

The element isolation structure may be used to isolate the active pattern. In semiconductor devices according to some embodiments, the element isolation structure 160 is defined between the first isolation spacers 440, thereby providing a semiconductor device with improved degree of integration and reliability. Further, the element isolation structure 160 applies compressive stress to the third active pattern F3 used as the PMOS channel region, which can provide a semiconductor device with improved performance.

When the element isolation structure applying compressive stress to the active pattern extends to the NMOS region, there can be a problem of deterioration of the performance of the NMOS region. In order to prevent this problem, the element isolation structure may be formed only in the PMOS channel region, but this can increase the complexity of the fabricating process.

However, semiconductor devices according to some embodiments, by forming the element isolation structure 160 to cross the first active pattern F1 and the first field insulating film 112, it is possible to reduce or prevent deterioration of the performance of the NMOS region. For example, the first field insulating film 112 may prevent deterioration of the performance of the semiconductor device by applying a tensile stress to the first active pattern F1 used as the channel region of the NMOS.

Figure 6:
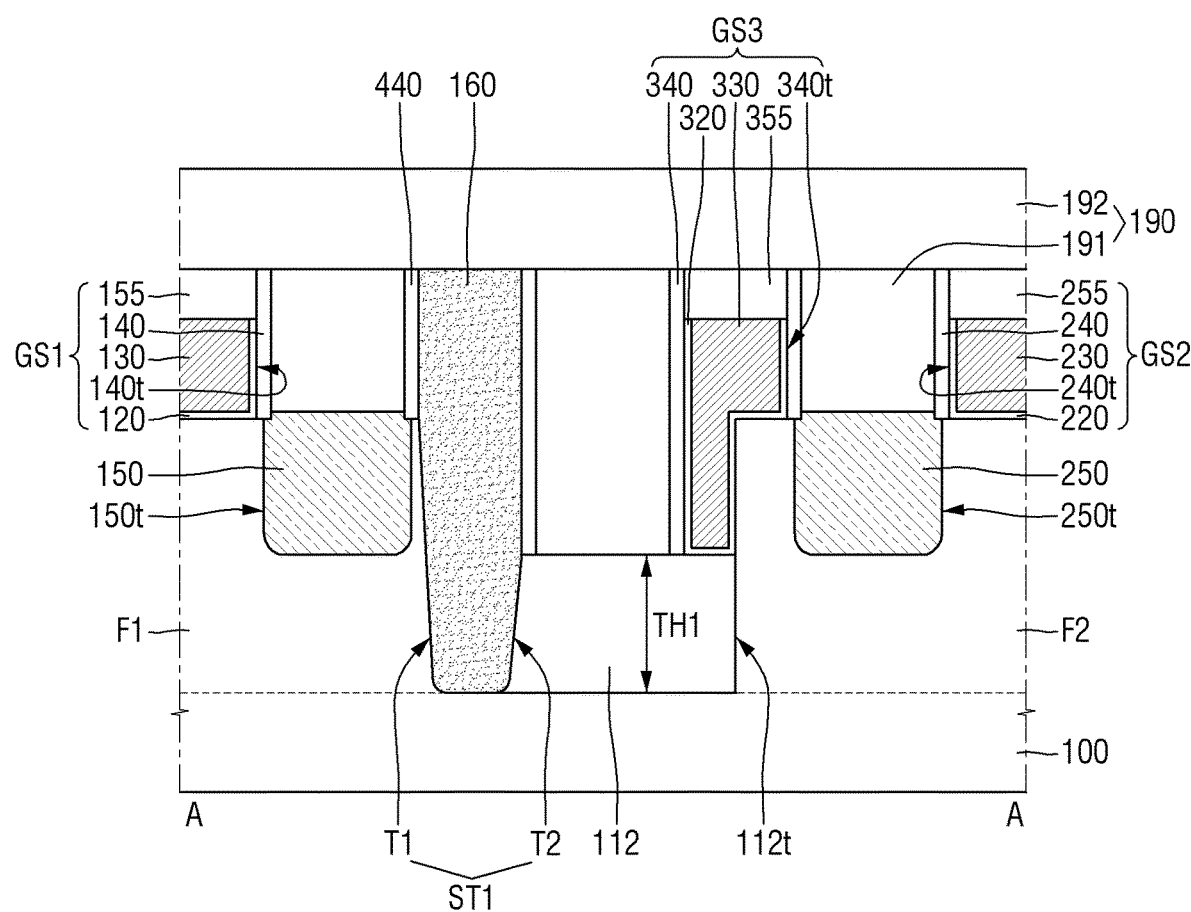
FIGS. 6 and 7 are cross-sectional views for explaining a semiconductor device according to some embodiments of the present inventive concept.
Figure 7:
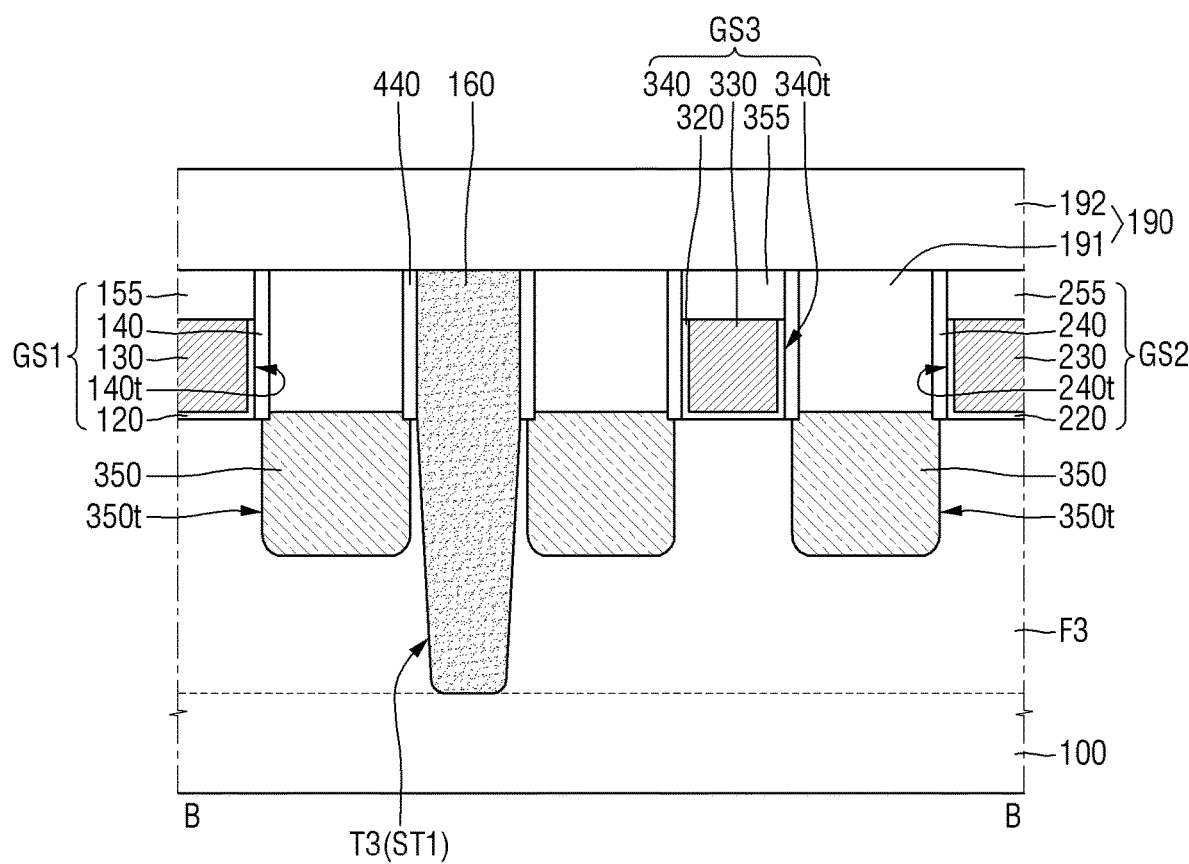

FIGS. 6 and 7 are cross-sectional views for explaining a semiconductor device according to some embodiments of the present inventive concept. For the sake of convenience of explanation, repeated description of items described with reference to FIGS. 1 to 5 may be limited or omitted.

Referring to FIGS. 6 and 7, in a semiconductor device according to some embodiments, a bottom surface of the element isolation structure 160 extends to the upper surface of the substrate 100. For example, the bottom surface of the first isolation trench ST1 may be defined by the upper surface of the substrate 100. In other words, when formed, the first isolation trench ST1 may expose the upper surface of the substrate 100.

In such a case, the third active pattern F3 may be severed by the first isolation trench ST1. For example, as illustrated in FIG. 7, the third active pattern F3 may be severed by the third trench T3, and divided into two fin portions spaced apart from each other in the first direction X and extending lengthwise along the first direction X.

Figure 8:
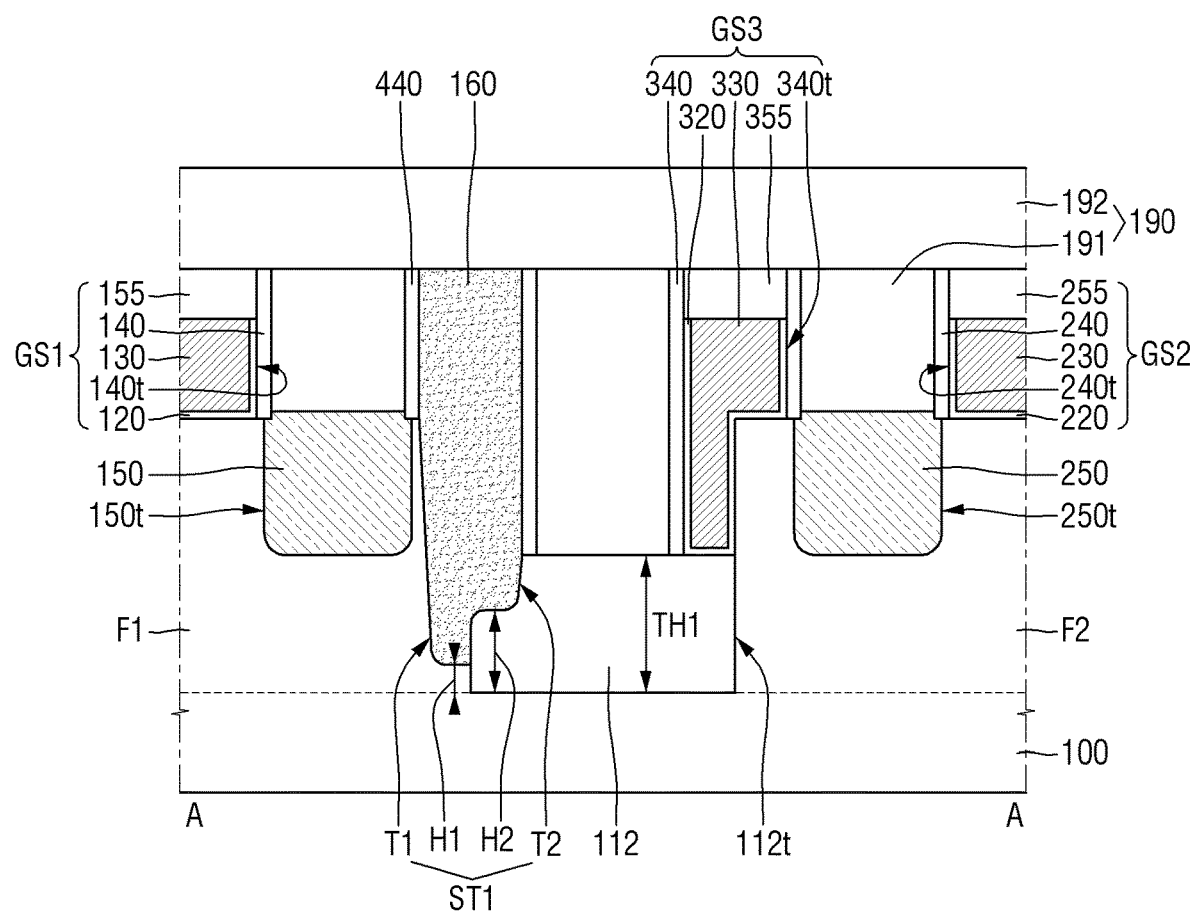
FIG. 8 is a cross-sectional view illustrating the semiconductor device according to some embodiments of the present inventive concept.

FIG. 8 is a cross-sectional view illustrating a semiconductor device according to some embodiments of the present inventive concept. For the sake of convenience of explanation, repeated description of items described with reference to FIGS. 1 to 5 may be omitted or limited.

Referring to FIG. 8, in a semiconductor device according to some embodiments, the element isolation structure 160 may extend deeper into the first active pattern F1 than into the first field insulating film 112. For example, the height H1 from the upper surface of the substrate 100 to the bottom surface of the first trench T1 may be less than the height H2 from the upper surface of the substrate 100 to the bottom surface of the second trench T2. This difference may be attributable, for example, to the characteristics of the etching process for forming the first isolation trench ST1.

In some embodiments, the difference between the height H1 of the bottom surface of the first trench T1 and the height H2 of the bottom surface of the second trench T2 may be adjusted to vary the stress applied to the first active pattern F1. Therefore, a semiconductor device with desirable performance may be provided.

Figure 9:
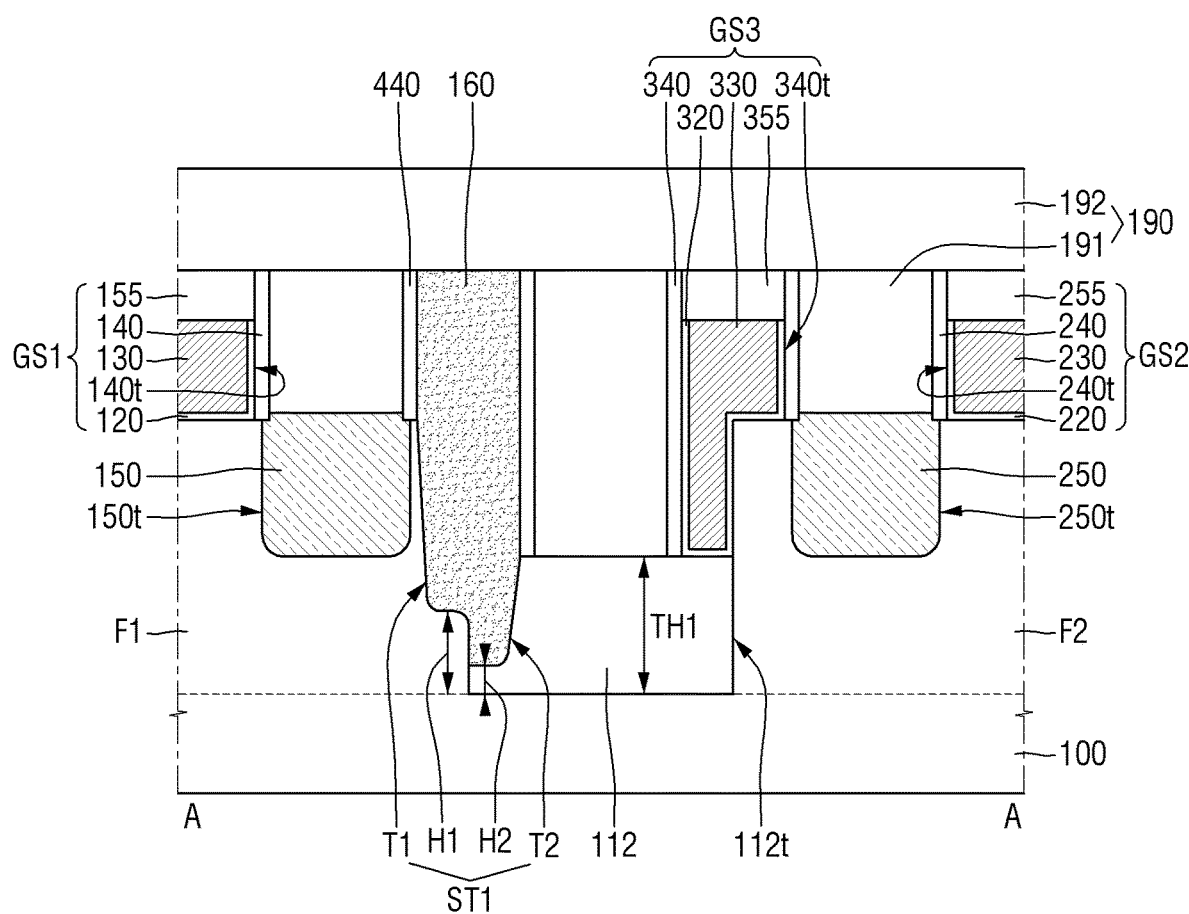
FIG. 9 is a cross-sectional view illustrating a semiconductor device according to some embodiments of the present inventive concept.

FIG. 9 is a cross-sectional view illustrating a semiconductor device according to some embodiments of the present inventive concept. For the sake of convenience of explanation, repeated description of items described with reference to FIGS. 1 to 5 may be limited or omitted.

Referring to FIG. 9, in a semiconductor device according to some embodiments, the element isolation structure 160 extends deeper into in the first field insulating film 112 than into the first active pattern F1. For example, the height H1 from the upper surface of the substrate 100 to the bottom surface of the first trench T1 may be greater than the height H2 from the upper surface of the substrate 100 to the bottom surface of the second trench T2. This height difference may be attributable, for example, to the characteristics of the etching process of forming the first isolation trench ST1.

In some embodiments, adjusting the difference between the height H1 of the bottom surface of the first trench T1 and the height H2 of the bottom surface of the second trench T2 can adjust the stress applied to the first active pattern F1. Therefore, a semiconductor device with desirable performance may be provided.

Figure 10:
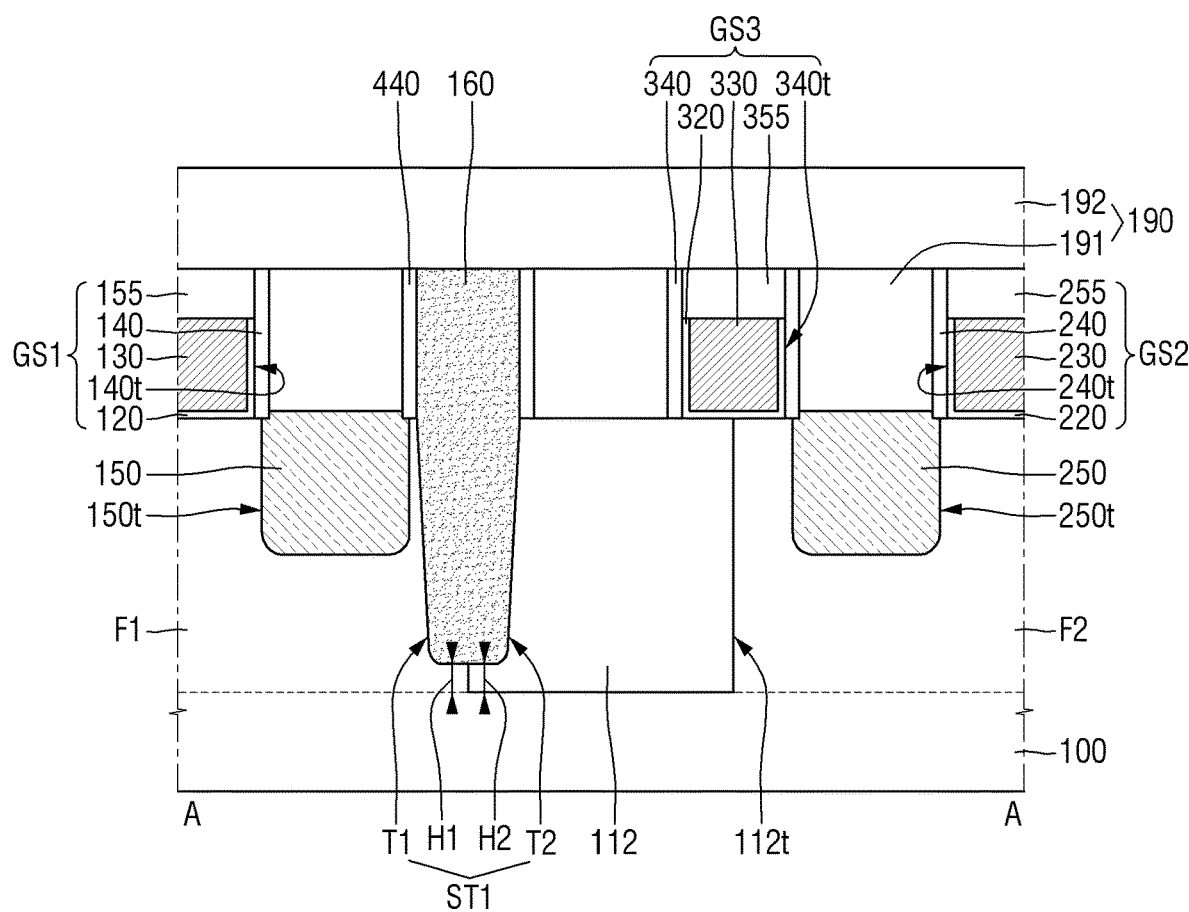
FIG. 10 is a cross-sectional view for explaining a semiconductor device according to some embodiments of the present inventive concept.

FIG. 10 is a cross-sectional view for explaining a semiconductor device according to some embodiments of the present inventive concept. For the sake of convenience of explanation, repeated description of items described with reference to FIGS. 1 to 5 will be omitted or limited.

Referring to FIG. 10, in a semiconductor device according to some embodiments, the upper surface of the first field insulating film 112 is disposed substantially on the same plane as the upper surfaces of the first and second active patterns F1 and F2. The height H1 of the bottom surface of the first trench T1 is illustrated as being the same as the height H2 of the bottom surface of the second trench T2, but this is only for convenience of description, and embodiments of the inventive concept are not limited thereto. For example, the height H1 of the bottom surface of the first trench T1 and the height H2 of the bottom surface of the second trench T2 may be different depending, for example, on the characteristics of the etching process of forming the first isolation trench ST1.

Figure 11:
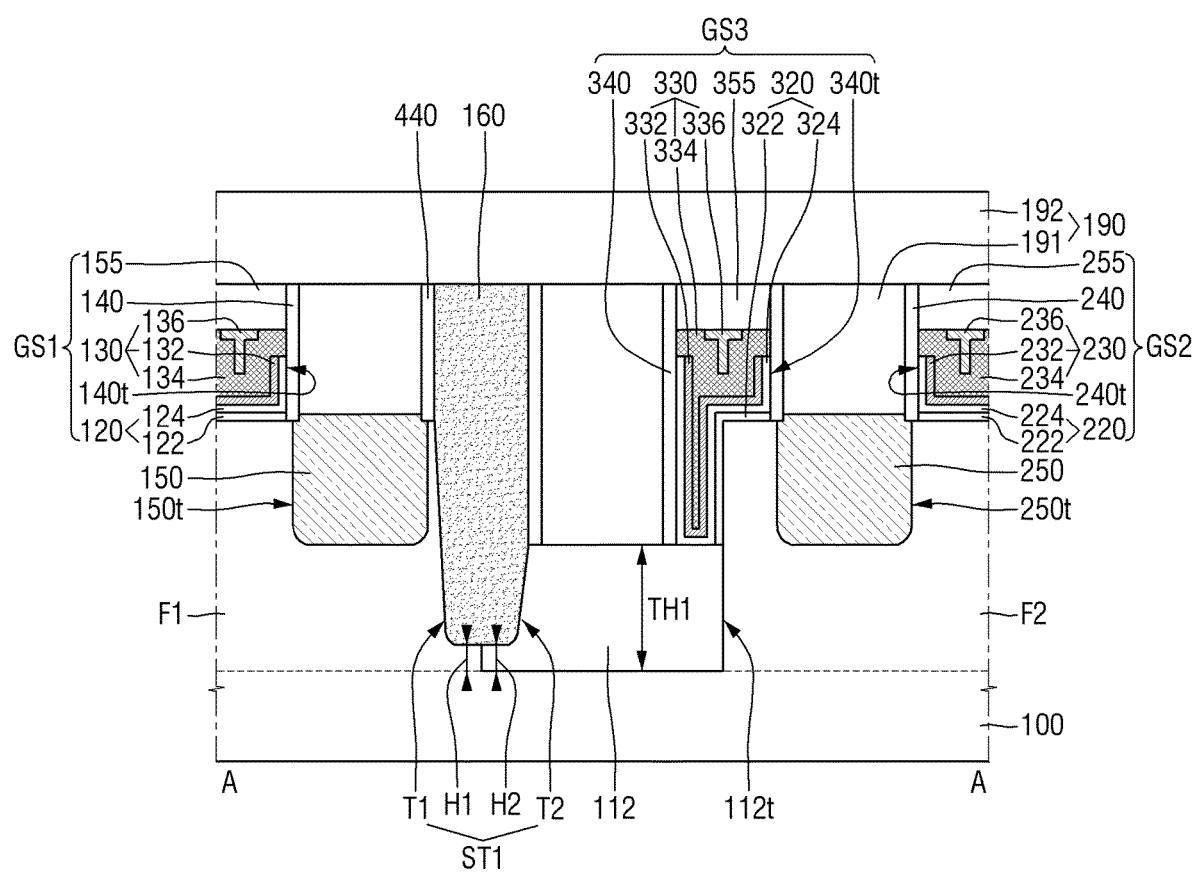
FIG. 11 is a cross-sectional view illustrating the semiconductor device according to some embodiments of the present inventive concept.

FIG. 11 is a cross-sectional view illustrating a semiconductor device according to some embodiments of the present inventive concept. For the sake of convenience of explanation, repeated description of items described with reference to FIGS. 1 to 5 may be limited or omitted.

Referring to FIG. 11, in a semiconductor device according to some embodiments, each of the first to third gate electrodes 130, 230, and 330 includes work function adjustment films 132, 232, 332 and 432, insertion films 134, 234, 334 and 434, and filling films 136, 236, 336 and 436. The first to third work function adjustment films 132, 232, 332 and 432 may be formed on the first to third gate insulating films 120, 220 and 320, respectively. In some embodiments, the first to third gate insulating films 120, 220 and 320 and the first to third work function adjustment films 132, 232, 332 and 432 may extend along only some parts of the side walls of the first to third gate trenches 140t, 240t and 340t. The first to third work function adjustment films 132, 232, 332 and 432 may include, for example, a TiN film.

The first to third insertion films 134, 234, 334 and 434 may be formed on the first to third work function adjustment films 132, 232, 332 and 432, respectively. In some embodiments, the first to third insertion films 134, 234, 334 and 434 may extend along the other parts of the side walls of the first to third gate trenches 140t, 240t and 340t, and the profiles of the first to third work function adjustment films 132, 232, 332 and 432, respectively. The first to third insertion films 134, 234, 334 and 434 may include, for example, at least one of Ti, TiAl, TiAlN, TiAlC, TiAlCN and combinations thereof.

The first to third filling films 136, 236, 336 and 436 may be formed on the first to third insertion films 134, 234, 334 and 434, respectively. In some embodiments, the first to third filling films 136, 236, 336 and 436 may fill the remaining regions of the first to third gate trenches 140t, 240t and 340t, respectively. For example, the first to third filling films 136, 236, 336 and 436 may include, for example, at least one of W, Al, Co, Cu, Ru, Ni, Pt, Ni—Pt, TiN and combinations thereof.

In some embodiments, each of the first to third gate insulating films 120, 220, and 320 may include interfacial films 122, 222, 322 and 422 and dielectric films 124, 224, 324 and 424. The first interfacial film 122 may extend along the outer surface of the first active pattern F1. The second and third interfacial films 222 and 322 may extend along the outer surface of the second active pattern F2.

The first to third dielectric films 124, 224, 324 and 424 may be formed on the first to third interfacial films 122, 222, 322 and 422, respectively. In some embodiments, the first to third dielectric films 124, 224, 324 and 424 extend along only a part of the side walls of the first to third gate trenches 140t, 240t and 340t. In some embodiments, uppermost surfaces of the first to third dielectric films 124, 224, 324 and 424, and uppermost surface of the first to third work function adjustment films 132, 232, 332 and 432 may be arranged substantially on the same plane.

Figure 12:
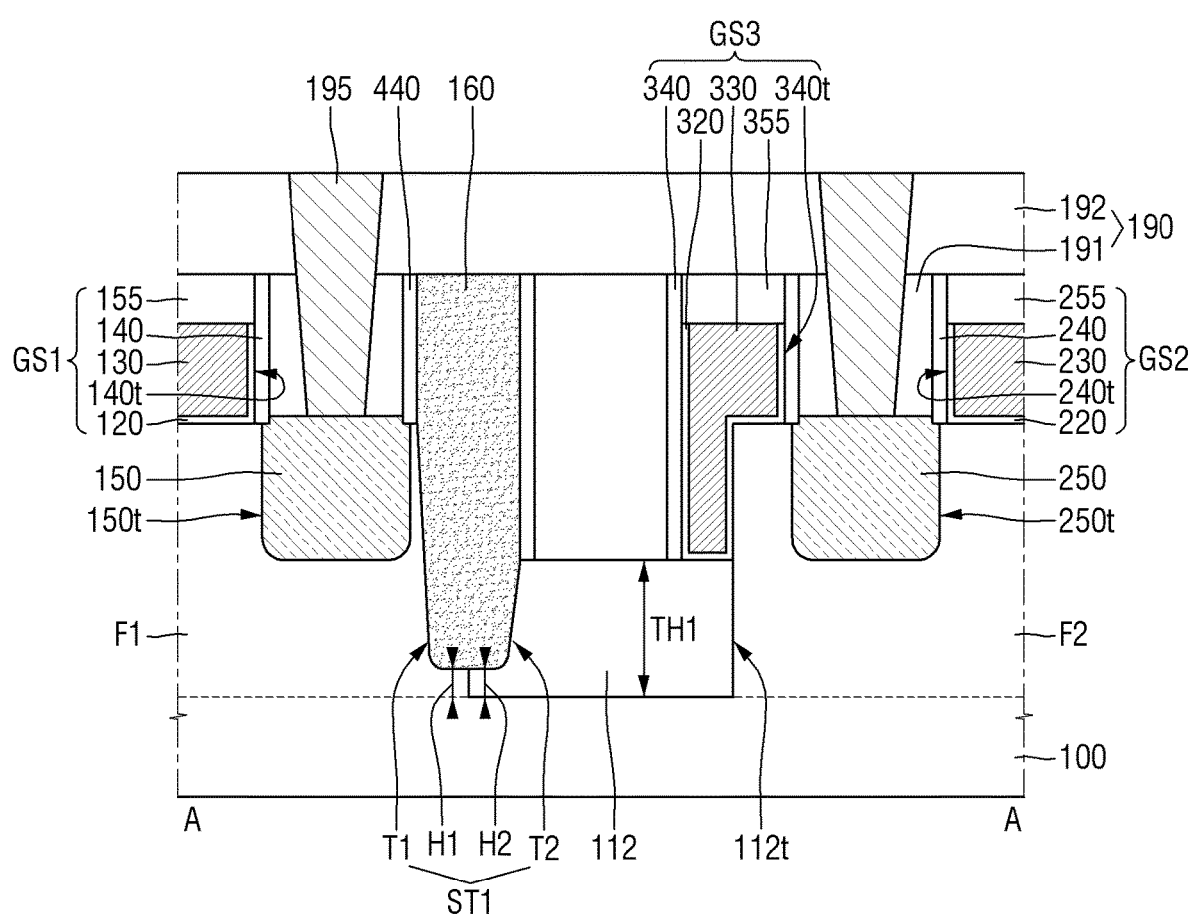
FIG. 12 is a cross-sectional view illustrating the semiconductor device according to some embodiments of the present inventive concept.

FIG. 12 is a cross-sectional view illustrating a semiconductor device according to some embodiments of the present inventive concept. For the sake of convenience of explanation, repeated description of items described with reference to FIGS. 1 to 5 may be limited or omitted.

Referring to FIG. 12, a semiconductor device according to some embodiments further includes a contact 195. The contact 195 may penetrate the interlayer insulating film 190 and be connected to the first and second source/drain regions 150 and 250. Although not illustrated, the contact 195 may also penetrate the interlayer insulating film 190 and be connected to the third source/drain region 350.

Although the contact 195 is illustrated as not being in contact with the first to third gate structures GS1, GS2 and GS3, but embodiments of the inventive concept are not limited thereto. For example, the contact 195 may also be in contact with the side walls of the first to third gate structures GS1, GS2 and GS3. The contact 195 may be formed, for example, by a self-aligned contact (SAC) process.

Although the contact 195 is illustrated as being made up of a single structure, embodiments of the inventive concept are not limited thereto. For example, the contact 195 may also include a plurality of structures. Also, unlike the illustrated example, a silicide film may be formed between the contact 195 and the first and second source/drain regions 150 and 250. The contact 195 may include, for example, at least one of tantalum (Ta), tantalum nitride (TaN), titanium (Ti), titanium nitride (TiN), tungsten nitride (WN), tungsten carbonitride (WCN), tungsten (W), cobalt (Co), ruthenium (Ru), molybdenum (Mo), nickel (Ni), aluminum (Al), copper (Cu), doped polysilicon and combinations thereof.

Figure 13:
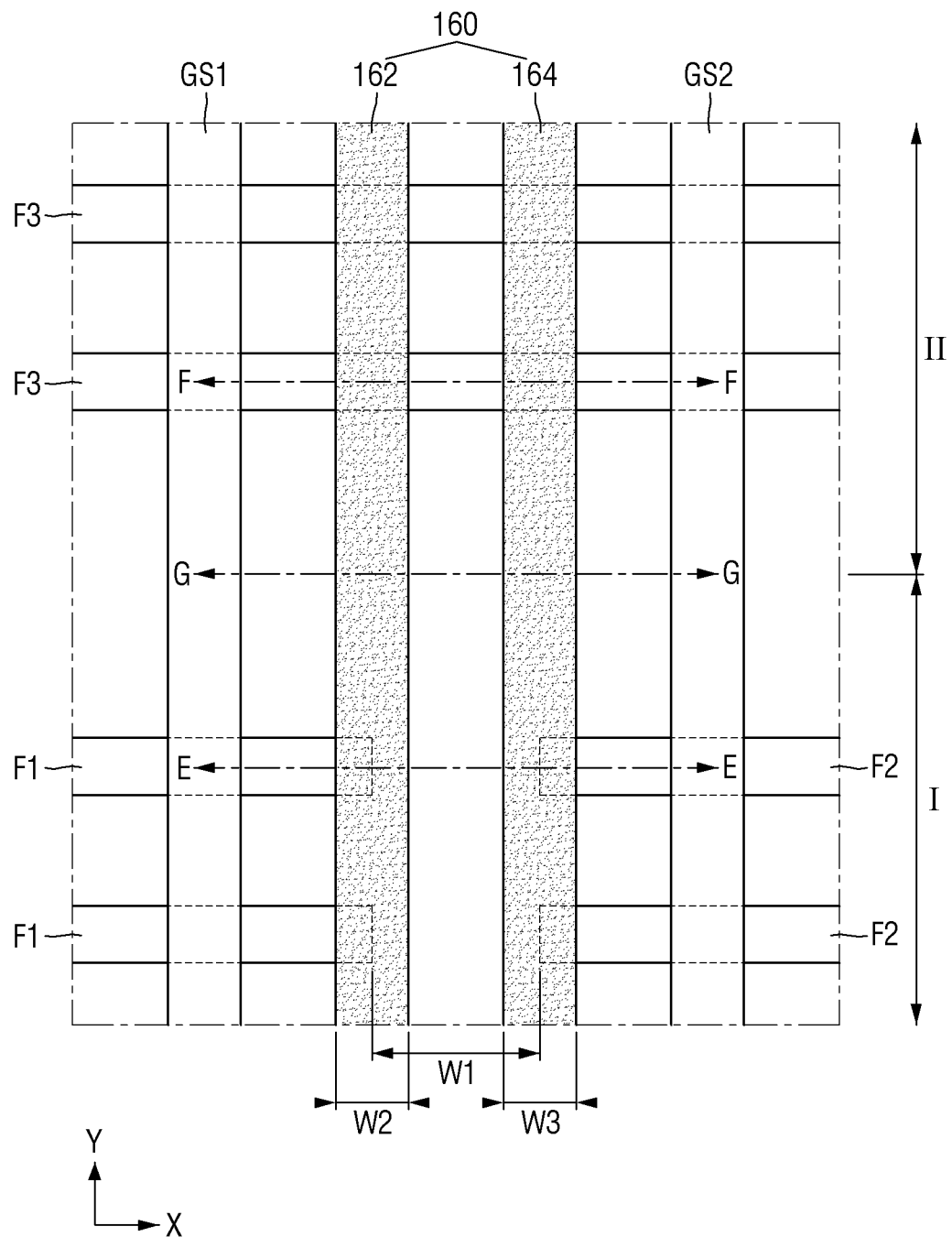
FIG. 13 is a schematic layout diagram for explaining a semiconductor device according to some embodiments of the present inventive concept.
Figure 14:
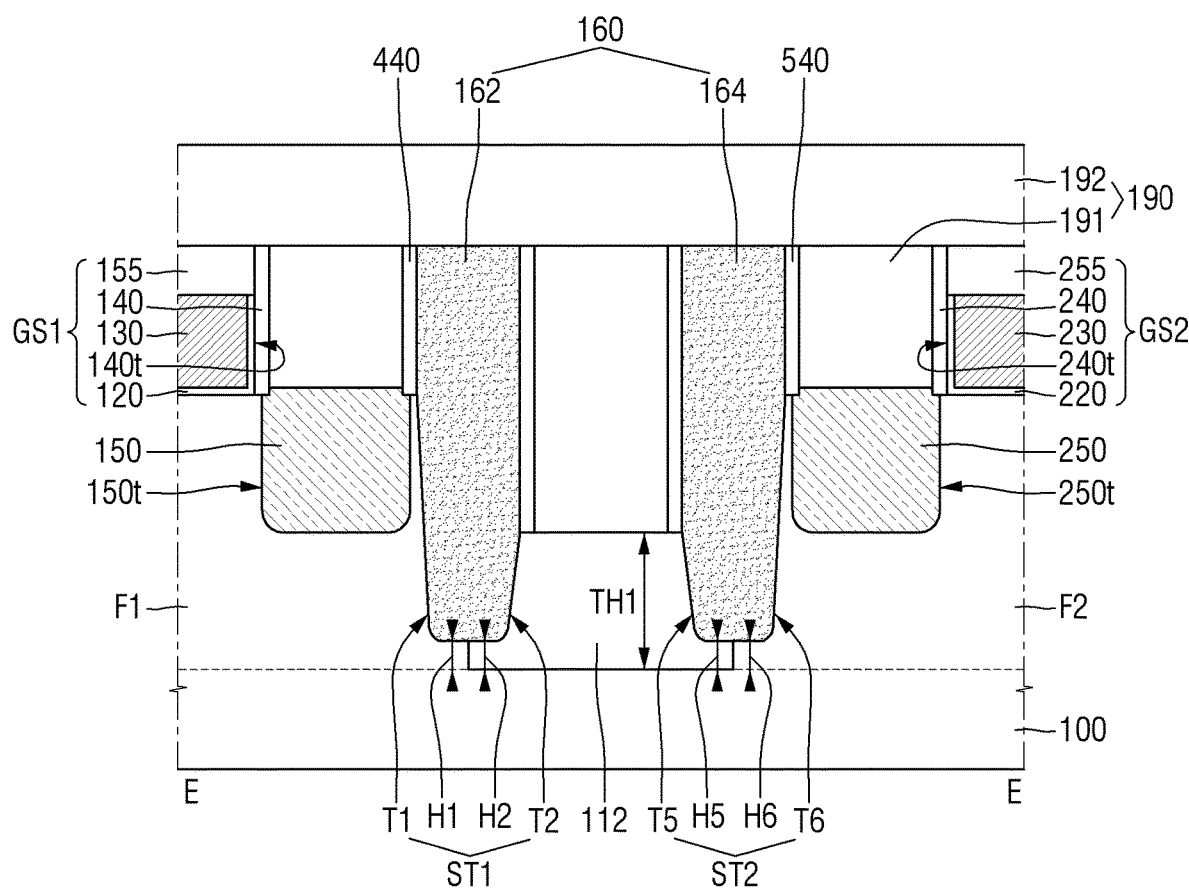
FIG. 14 is a cross-sectional view taken along line E-E of FIG. 13.
Figure 15:
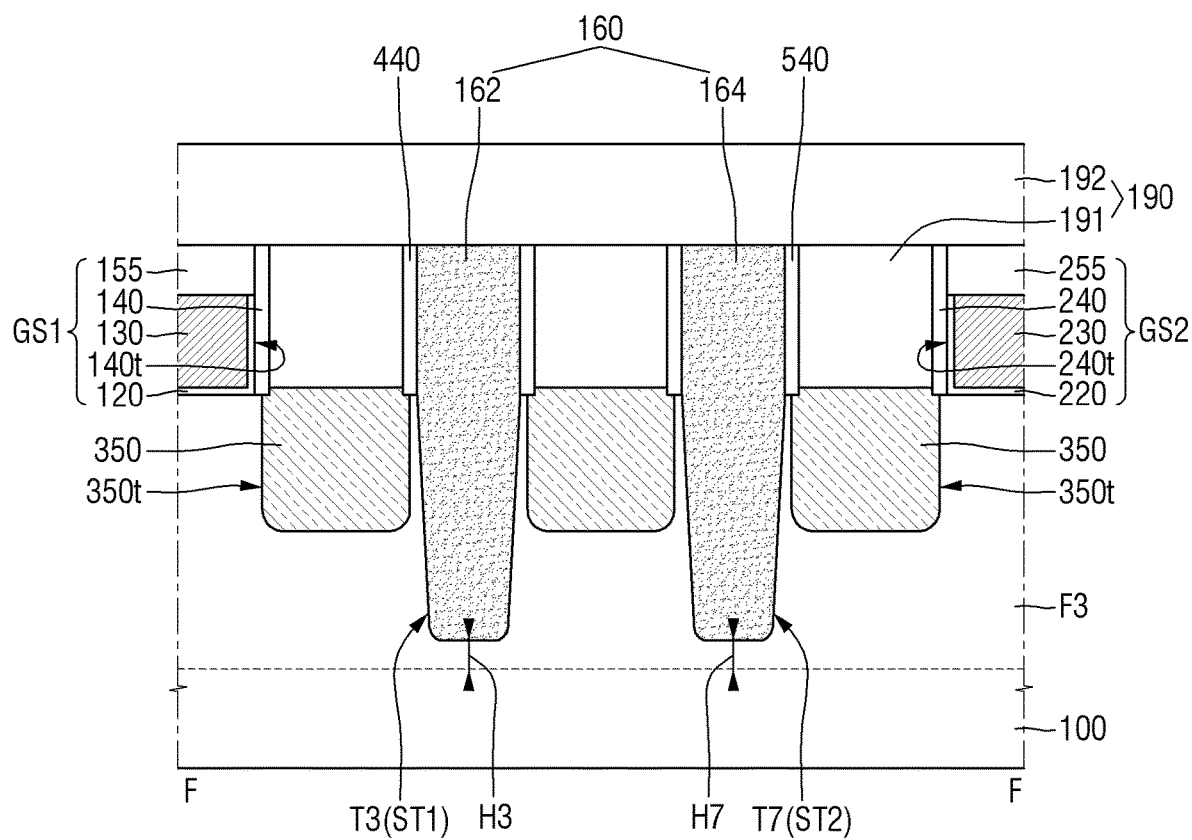
FIG. 15 is a cross-sectional view taken along line F-F of FIG. 13.
Figure 16:
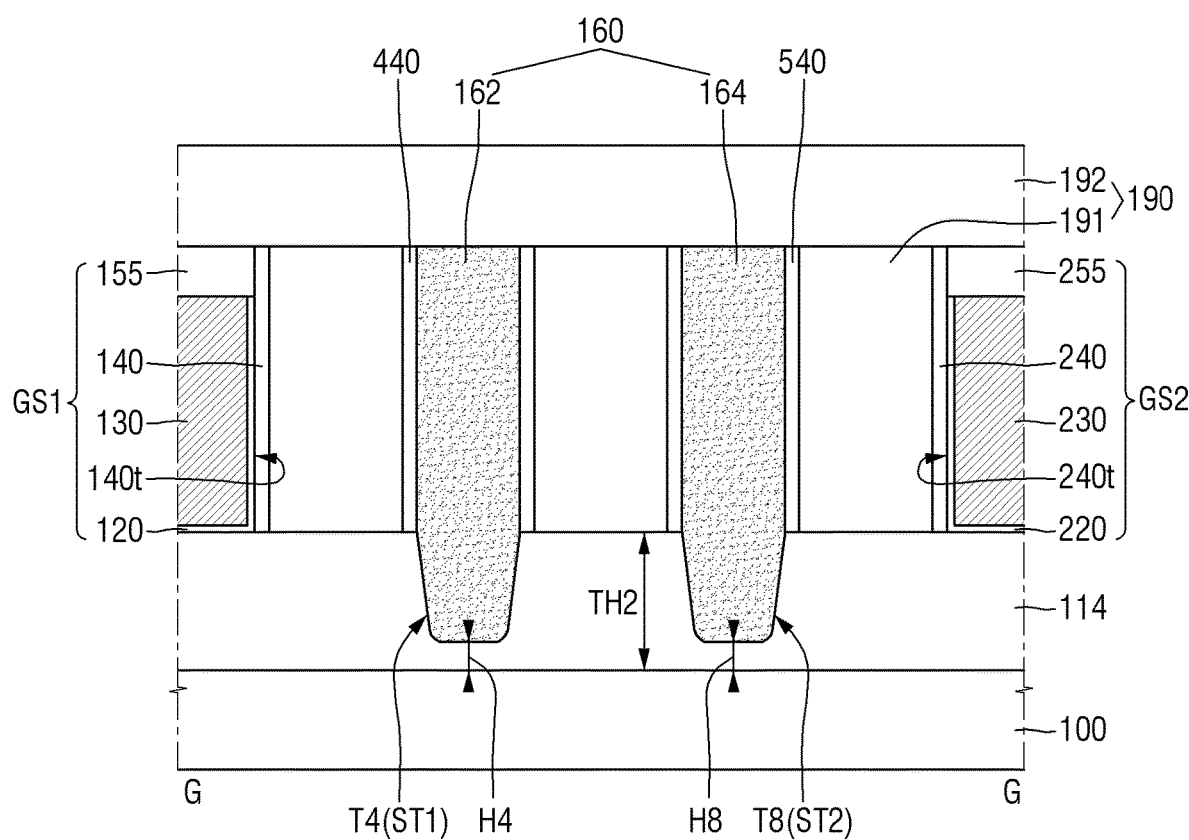
FIG. 16 is a cross-sectional view taken along the line G-G of FIG. 13.

FIG. 13 is a schematic layout diagram for explaining a semiconductor device according to some embodiments of the present inventive concept. FIG. 14 is a cross-sectional view taken along line E-E of FIG. 13. FIG. 15 is a cross-sectional view taken along line F-F of FIG. 13. FIG. 16 is a cross-sectional view taken along the line G-G of FIG. 13. For the sake of convenience of explanation, repeated description of items described with reference to FIGS. 1 to 5 may be limited or omitted.

Referring to FIGS. 13 to 16, in a semiconductor device according to some embodiments, the element isolation structure 160 includes a first isolation region 162 and a second isolation region 164. The first isolation region 162 of the element isolation structure 160 may fill the first isolation trench ST1. The second isolation region 164 of the element isolation structure 160 may fill the second isolation trench ST2. Since the first isolation region 162 of the element isolation structure 160 is substantially the same as the element isolation structure 160 according to FIGS. 1 to 5, repeated explanation thereof will be omitted.

The second isolation trench ST2 may extend lengthwise in the second direction Y. The second isolation trench ST2 may include a fifth trench T5 in the first field insulating film 112, a sixth trench T6 in the second active pattern F2, a seventh trench T7 in the third active pattern F3, and an eighth trench T8 in the second field insulating film 114.

As illustrated in FIG. 14, the second isolation region 164 which fills the fifth trench T5 and the sixth trench T6 may cross between the second active pattern F2 and the first field insulating film 112. As illustrated in FIG. 15, the second isolation region 164 which fills the seventh trench T7 may cross the third active pattern F3.

In some embodiments, the height H5 from the upper surface of the substrate 100 to the bottom surface of the fifth trench T5 may be substantially the same as the height H7 from the upper surface of the substrate 100 to the bottom surface of the seventh trench T7. In some embodiments, the height H6 from the upper surface of the substrate 100 to the bottom surface of the sixth trench T6 may be substantially the same as the height H8 from the upper surface of the substrate 100 to the bottom surface of the eighth trench T8.

In FIG. 14, the height H5 of the bottom surface of the fifth trench T5 is illustrated as being the same as the height H6 of the bottom surface of the sixth trench T6, but this is only for convenience of description, and embodiments of the inventive concept are not limited thereto.

In some embodiments, the height H1 of the bottom surface of the first trench T1 may be substantially the same as the height H6 of the bottom surface of the sixth trench T6, and the height H2 of the bottom surface of the second trench T2 may be substantially the same as the height H5 of the bottom surface of the fifth trench T5. In some embodiments, the height H3 of the bottom surface of the third trench T3 may be substantially the same as the height H7 of the bottom surface of the seventh trench T7, and the height H4 of the bottom surface of the fourth trench T4 may be substantially the same as the height H8 of the bottom surface of the eighth trench T8.

In some embodiments, the first isolation region 162 and the second isolation region 164 may be spaced apart. For example, a first interlayer insulating film 191 may be interposed between the first isolation region 162 and the second isolation region 164.

In some embodiments, a second separation spacer 540 may be further formed on the side wall of the second isolation region 164. The second separation spacer 540 may extend lengthwise along the second direction Y. For example, the second isolation spacer 540 on one side wall of the second isolation region 164 may be formed along the upper surface of the second active pattern F2, the upper surface of the third active pattern F3, and the upper surface of the second field insulating film 114. Further, for example, the second isolation spacer 540 on the other side wall of the second isolation region 164 may extend along the upper surface of the first field insulating film 112, the upper surface of the third active pattern F3, and the upper surface of the second field insulating film 114. In some embodiments, the second isolation spacer 540 may be formed at the same level as those of the first to third gate spacers 140, 240 and 340 and the first isolation spacer 440.

In some embodiments, the width W3 of the second isolation region 164 may be defined by the distance between the second separation spacers 540. For example, the width W3 of the second isolation region 164 may be substantially the same as the width W2 of the first isolation region 162. In some embodiments, the width W2 of the first isolation region 162 and the width W3 of the second isolation region 164 may be less than the width W1 of the first field insulating film 112.

Figure 17:
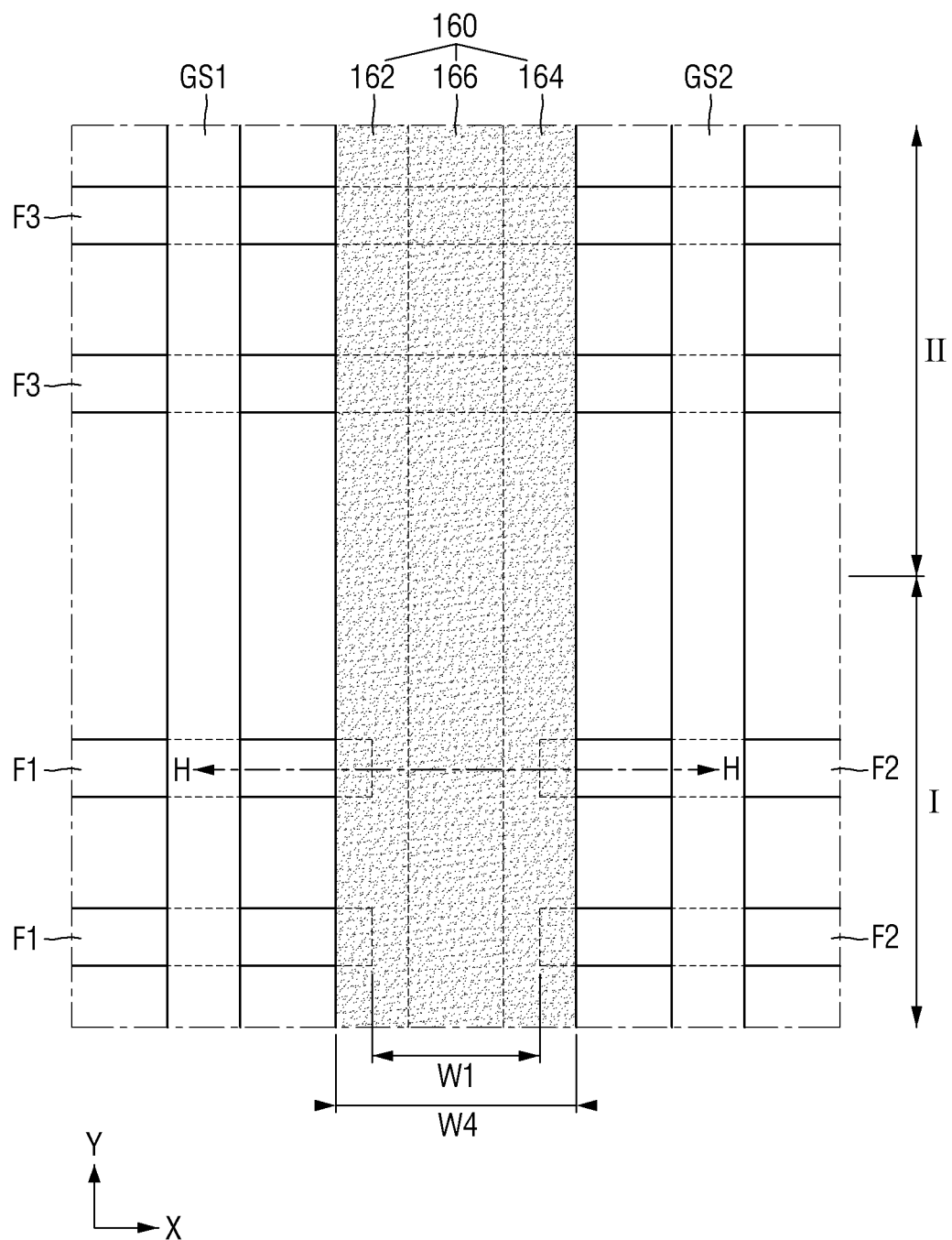
FIG. 17 is a schematic layout diagram for explaining a semiconductor device according to some embodiments of the present inventive concept.
Figure 18:
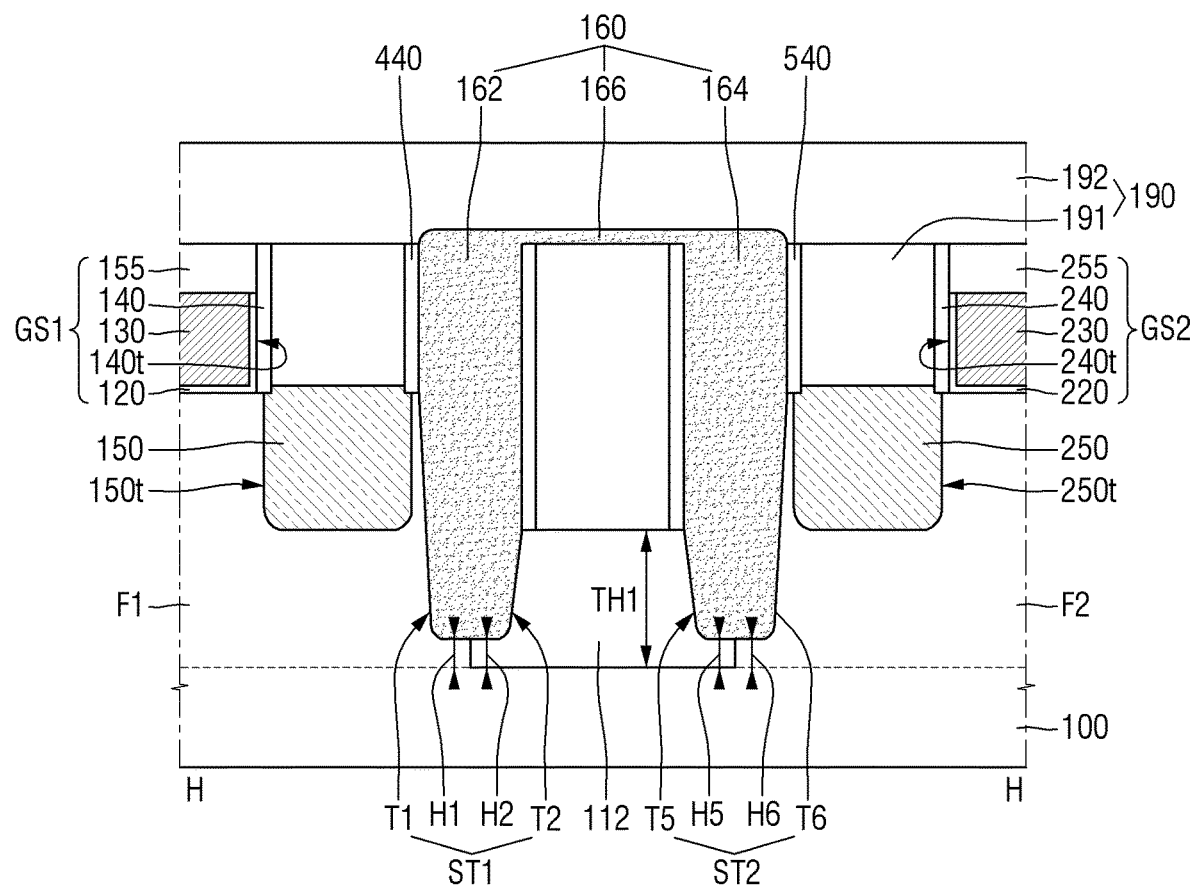
FIG. 18 is a cross-sectional view taken along line H-H of FIG. 17.

FIG. 17 is a schematic layout diagram for explaining a semiconductor device according to some embodiments of the present inventive concept. FIG. 18 is a cross-sectional view taken along line H-H of FIG. 17. For the sake of convenience of explanation, repeated description of items described with reference to FIGS. 1-5 and 13-17 may be limited or omitted.

Referring to FIGS. 17 and 18, in a semiconductor device according to some embodiments, the element isolation structure 160 further includes a connecting isolation region 166. The connecting isolation region 166 of the element isolation structure 160 may connect the first isolation region 162 and the second isolation region 164. For example, the connecting isolation region 166 may be formed on the first interlayer insulating film 191 between the first isolation region 162 and the second isolation region 164. In such a case, the connecting isolation region 166 may connect the upper part of the first isolation region 162 and the upper part of the second isolation region 164 to each other.

In some embodiments, the upper surface of the connecting isolation region 166 may be higher than the upper surfaces of the first to third gate structures GS1, GS2 and GS3. The connecting isolation region 166 may be formed, for example, as a residue of a planarization process for forming the first isolation region 162 and the second isolation region 164.

Figure 19:
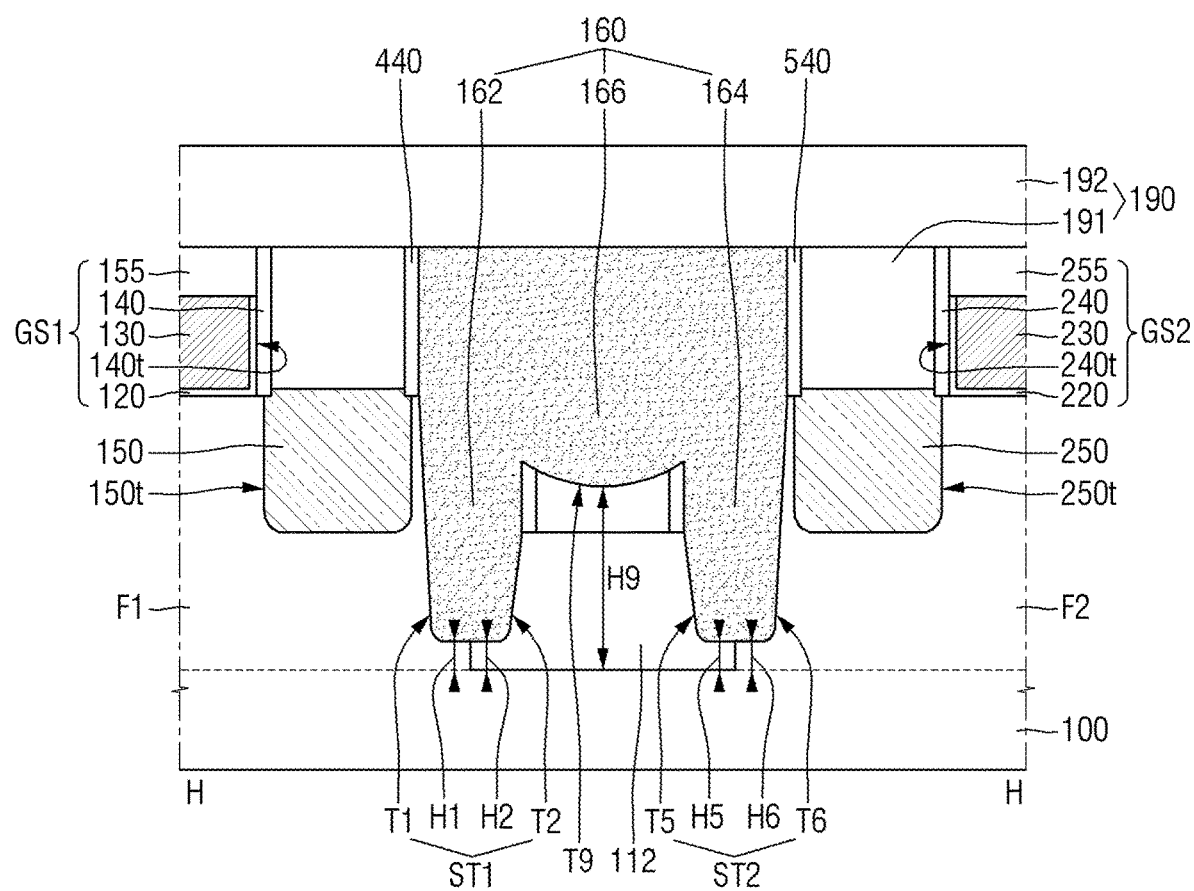
FIG. 19 is a cross-sectional view illustrating the semiconductor device according to some embodiments of the present inventive concept.

FIG. 19 is a cross-sectional view illustrating a semiconductor device according to some embodiments of the present inventive concept. For the sake of convenience of explanation, repeated description of items described with reference to FIGS. 1 to 5 and 13 to 18 may be limited or omitted.

Referring to FIG. 19, in a semiconductor device according to some embodiments, the bottom surface of the connecting isolation region 166 is higher than the upper surface of the first field insulating film 112, and is lower than the upper surfaces of the first to third gate structures GS1, GS2 and GS3. For example, the connecting isolation region 166 may fill a ninth trench T9 in the first interlayer insulating film 191. The ninth trench T9 may be formed in the first interlayer insulating film 191 between the first isolation region 162 and the second isolation region 164.

A height H9 of a lowermost part of the ninth trench T9 may be greater than the upper surface of the first field insulating film 112. However, the height H9 of the lowermost part of the ninth trench T9 may be less than the upper surfaces of the first to third gate structures GS1, GS2 and GS3.

Although the height H9 of the lowermost part of the ninth trench T9 is only illustrated to be less than the upper surfaces of the first and second active patterns F1 and F2, embodiments of the inventive concept are not limited thereto. In some embodiments, the height H9 of the lowermost part of the ninth trench T9 may be higher than the upper surfaces of the first and second active patterns F1 and F2, and may be lower than the upper surfaces of the first to third gate structures GS1, GS2 and GS3.

In some embodiments, the bottom surface of the connecting isolation region 166 may be convex downward. However, embodiments of the inventive concept are not limited thereto, and the bottom surface of the connecting isolation region 166 may have various shapes depending, for example, on the characteristics of the etching process for forming the ninth trench T9.

Figure 20:
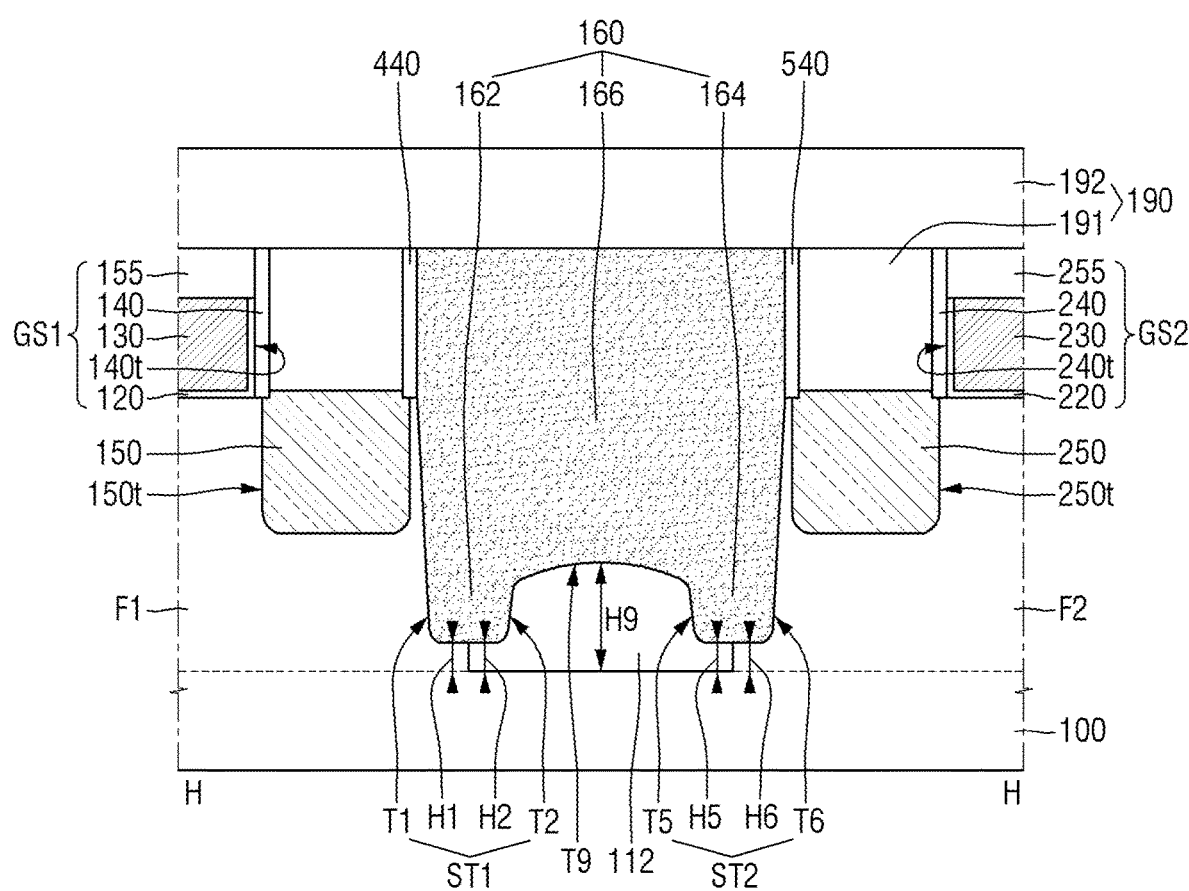
FIG. 20 is a cross-sectional view illustrating the semiconductor device according to some embodiments of the present inventive concept.

FIG. 20 is a cross-sectional view illustrating a semiconductor device according to some embodiments of the present inventive concept. For the sake of convenience of explanation, repeated description of items described with reference to FIGS. 1 to 5 and 13 to 19 may be limited or omitted.

Referring to FIG. 20, in a semiconductor device according to some embodiments, the bottom surface of the connecting isolation region 166 is higher than the upper surface of the substrate 100, and is lower than the upper surfaces of the first and second source/drain regions 150 and 250. For example, the bottom height H9 of the lowermost part of the ninth trench T9 may be greater than the upper surface of the substrate 100. However, the height H9 of the lowermost part of the ninth trench T9 may be less than the upper surfaces of the first and second source/drain regions 150 and 250.

In some embodiments, the bottom surface of the connecting isolation region 166 may be concave downward. However, embodiments of the inventive concept are not limited thereto, and the bottom surface of the connecting isolation region 166 may have various shapes depending, on the characteristics of the etching process for forming the ninth trench T9.

Figure 21:
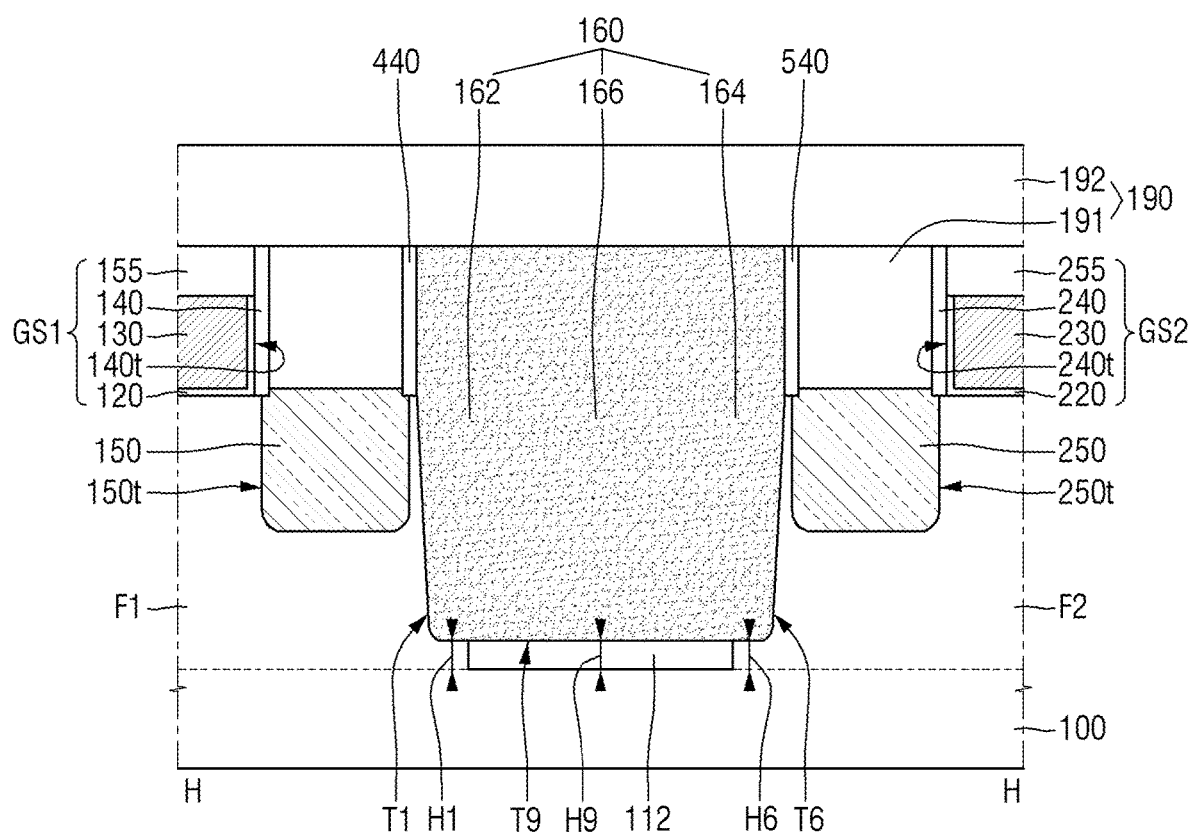
FIG. 21 is a cross-sectional view for explaining a semiconductor device according to some embodiments of the present inventive concept.

FIG. 21 is a cross-sectional view for explaining a semiconductor device according to some embodiments of the present inventive concept. For the sake of convenience of explanation, repeated description of items described with reference to FIGS. 1 to 5 and 13 to 20 may be limited or omitted.

Referring to FIG. 21, in a semiconductor device according to some embodiments, the bottom surface of the connecting isolation region 166 is disposed substantially on the same plane as the bottom surface of the first isolation region 162 and the bottom surface of the second isolation region 164. For example, the height H9 of the bottom surface of the ninth trench T9 may be substantially the same as the height H1 of the bottom surface of the first trench T1 and the height H6 of the bottom surface of the sixth trench T6.

Figure 22:
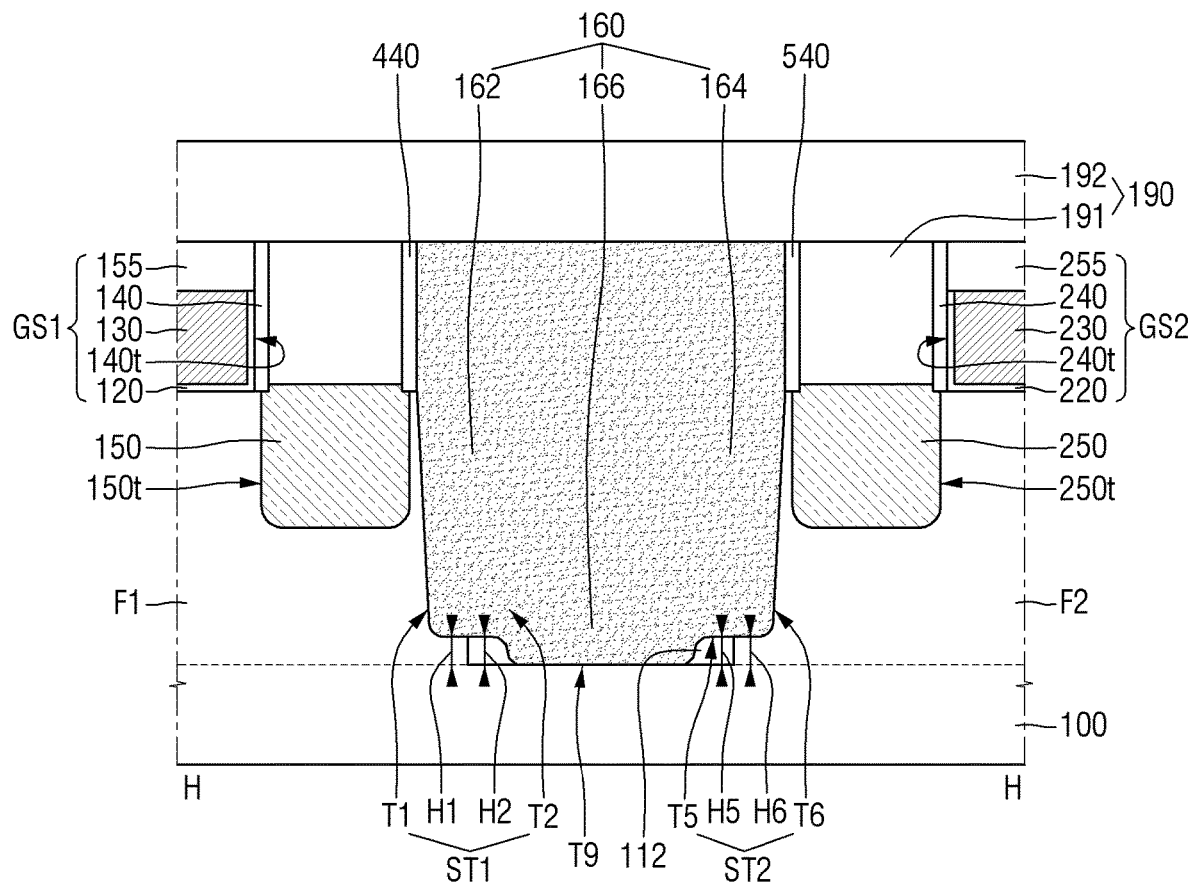
FIG. 22 is a cross-sectional view illustrating the semiconductor device according to some embodiments of the present inventive concept.

FIG. 22 is a cross-sectional view illustrating a semiconductor device according to some embodiments of the present inventive concept. For the sake of convenience of explanation, repeated description of items described with reference to FIGS. 1 to 5 and 13 to 21 may be limited or omitted.

Referring to FIG. 22, in a semiconductor device according to some embodiments, the bottom surface of the connecting isolation region 166 is lower than the bottom surface of the first isolation region 162 and the bottom surface of the second isolation region 164. For example, the height of the bottom surface of the ninth trench T9 may be less than the height H1 of the bottom surface of the first trench T1 and the height H6 of the bottom surface of the sixth trench T6. Further, for example, the height of the bottom surface of the ninth trench T9 may be less than the height H2 of the bottom surface of the second trench T2 and the height H5 of the bottom surface of the fifth trench T5.

The height of the bottom surface of the ninth trench T9 is illustrated as being disposed on the same plane as the upper surface of the substrate 100, but embodiments of the inventive concept are not limited thereto. For example, the height of the bottom surface of the ninth trench T9 may be greater than or less than the height of the upper surface of the substrate 100.

Hereinafter, a method for fabricating a semiconductor device according to some embodiments of the present inventive concept will be described with reference to FIGS. 1 to 5, 13 to 16, and 23 to 33. FIGS. 23 to 30 are intermediate step diagrams for explaining the method for fabricating a semiconductor device according to some embodiments of the present inventive concept. For the sake of convenience of explanation, repeated description of items described with reference to FIGS. 1 to 22 may be limited or omitted.

Figure 23:
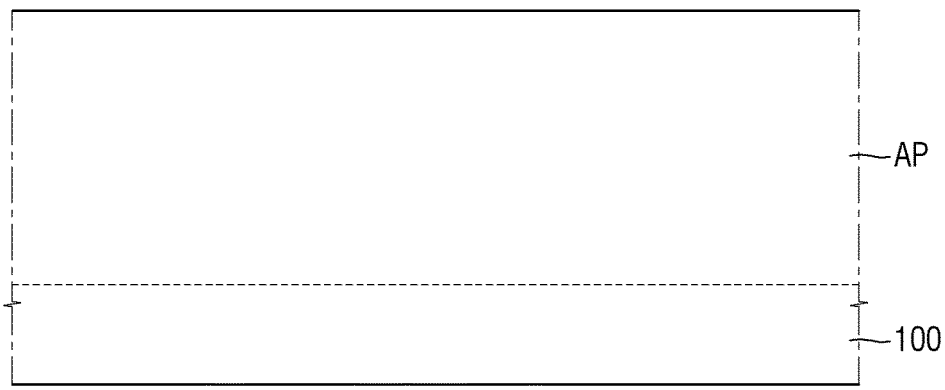
FIGS. 23 to 30 are intermediate step diagrams for explaining the method for fabricating the semiconductor device according to some embodiments of the present inventive concept.

Referring to FIG. 23, an active pattern AP is formed on a substrate 100.

An active pattern AP may be formed to protrude from the substrate 100. For example, the active pattern AP may extend in the first direction (X of FIG. 1). The active pattern AP may be a part of the substrate 100 and may include an epitaxial layer grown from the substrate 100.

Figure 24:
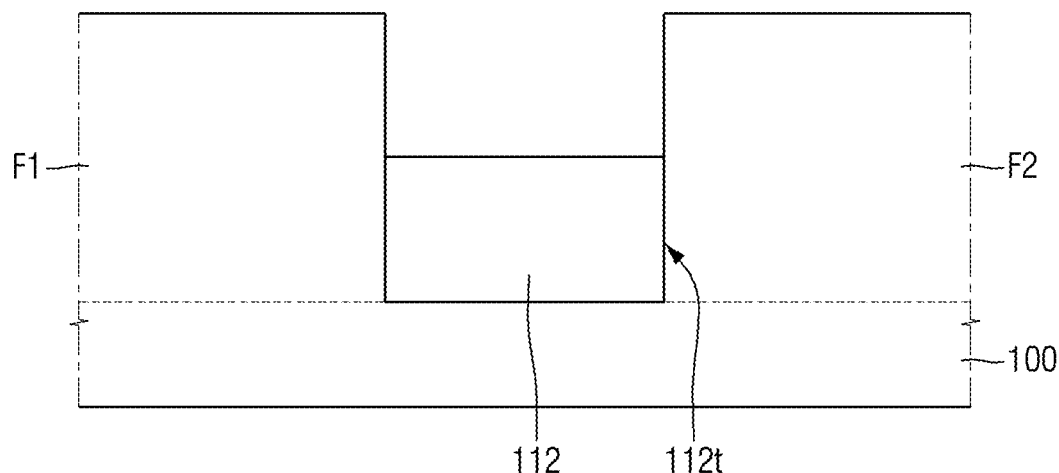

Referring to FIG. 24, the active pattern AP is isolated. For example, a fin cut trench 112t may be formed in the active pattern AP. Subsequently, a first field insulating film 112 which fills at least a part of the fin cut trench 112t may be formed. Thus, the first active pattern F1 and the second active pattern F2 separated by the first field insulating film 112 may be formed on the substrate 100.

In some embodiments, the height of the upper surface of the first field insulating film 112 may be less than the height of the upper surface of the first active pattern F1 and the upper surface of the second active pattern F2. For example, a recess process of the first field insulating film 112 may be performed, and the first field insulating film 112 having an upper surface lower than the height of the upper surface of the first active pattern F1 and the upper surface of the second active pattern F2 may be formed.

Figure 25:
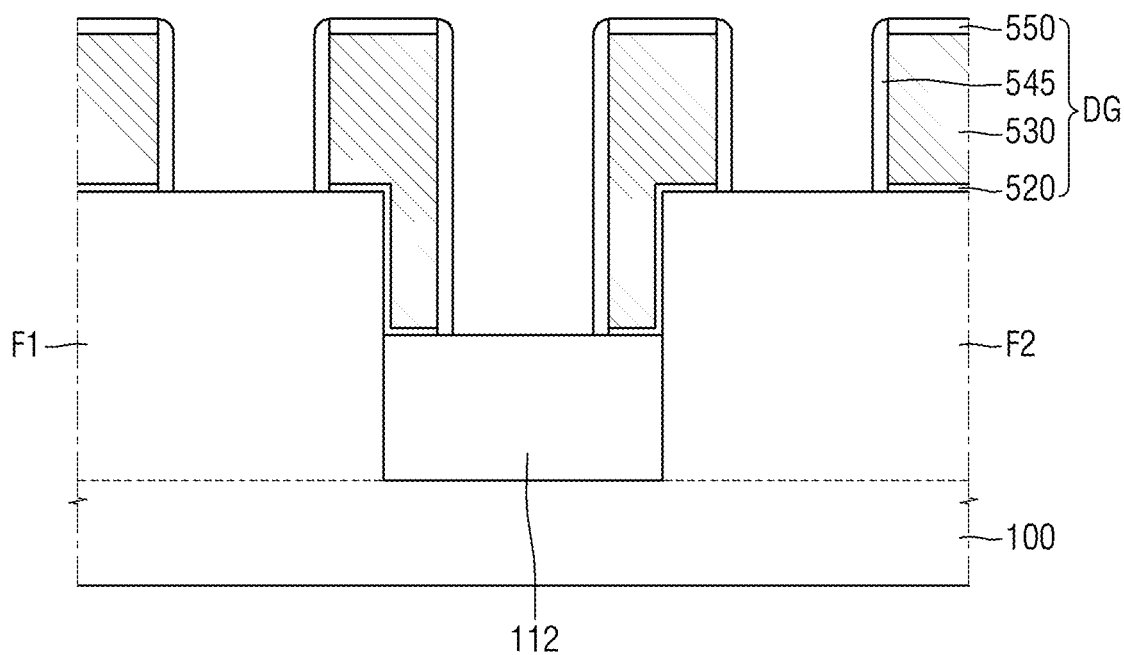

Referring to FIG. 25, a plurality of dummy gate structures DG is formed on the first field insulating film 112, the first active pattern F1 and the second active pattern F2. The plurality of dummy gate structures DG may be formed to intersect the first active pattern F1 and the second active pattern F2. For example, each dummy gate structure DG may extend in the second direction (Y of FIG. 1). In some embodiments, each dummy gate structure DG may include a dummy gate insulating film 520, a dummy gate electrode 530, a preliminary gate spacer 545, and a dummy capping pattern 550.

In some embodiments, a part of the plurality of dummy gate structures DG may extend along the upper surface of the first active pattern F1 and the upper surface of the first field insulating film 112. Further, the other part of the plurality of dummy gate structures DG may extend along the upper surface of the second active pattern F4 and the upper surface of the first field insulating film 112.

Figure 26:
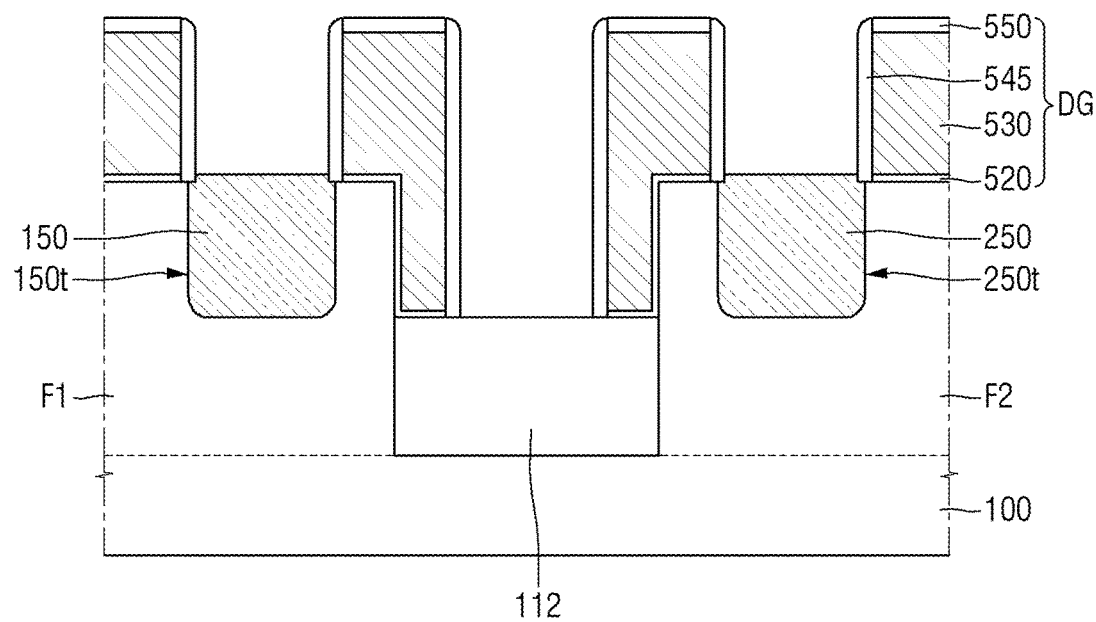

Referring to FIG. 26, first and second source/drain regions 150 and 250 are formed in the first active pattern F1 and the second active pattern F2, respectively. For example, some parts of the first and second active patterns F1 and F2 may be etched using each dummy gate structure DG as an etching mask. As a result, a first source/drain trench 150t may be formed in the first active pattern F1, and a second source/drain trench 250t may be formed in the second active pattern F2.

Subsequently, first and second source/drain regions 150 and 250 which respectively fill the first and second source/drain trenches 150t and 250t may be formed. The first and second source/drain regions 150 and 250 may be formed by, for example, an epitaxial growth process, but embodiments of the inventive concept are not limited thereto.

Figure 27:
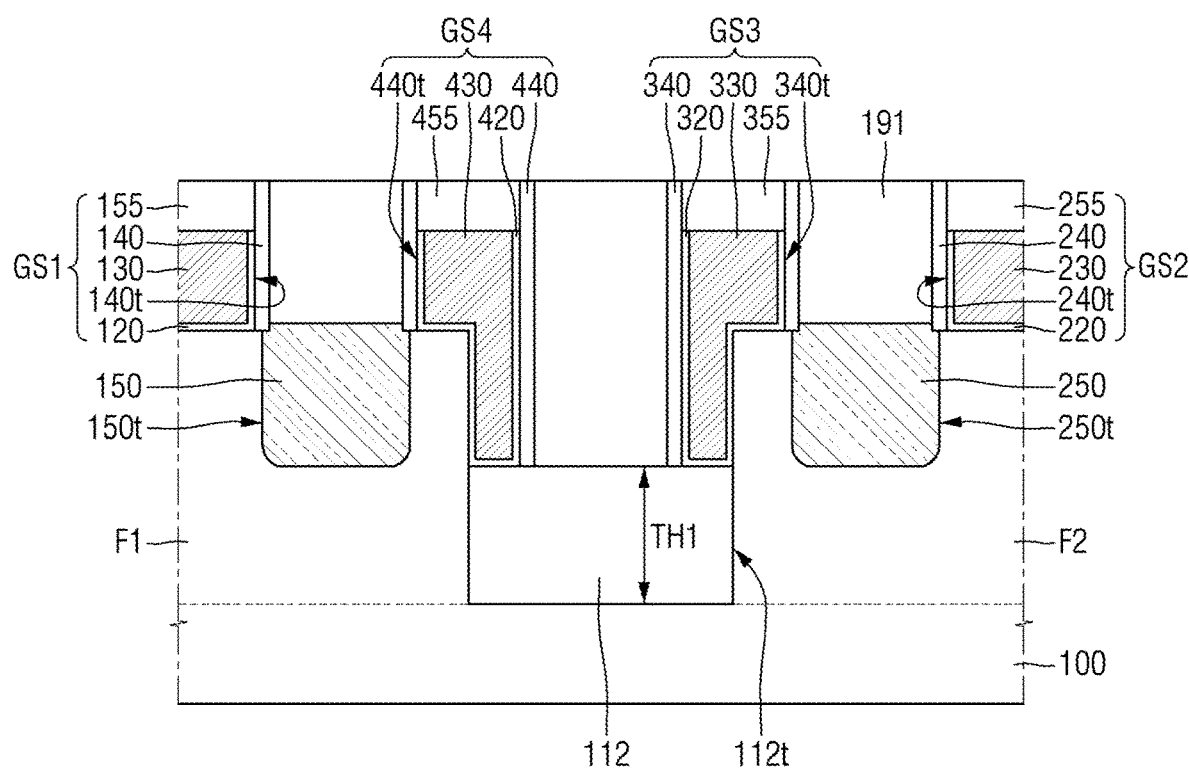

Referring to FIG. 27, the first to third gate structures GS1, GS2 and GS3 are formed in place of the dummy gate insulating film 520 and the dummy gate electrode 530. For example, a first interlayer insulating film 191 which covers the side wall of each dummy gate structure DG may be formed. Subsequently, the dummy gate insulating film 520 and the dummy gate electrode 530 may be removed, defining a plurality of gate trenches 140t, 240t 340t, and 440t in the first interlayer insulating film 191. Subsequently, the gate insulating films 120, 220, 320 and 420, the gate electrodes 130, 230, 330 and 430, and the capping patterns 155, 255, 355 and 455 may be filled in the respective gate trenches 140t, 240t 340t and 440t, forming first to fourth gate structures GS1, GS2, GS3 and GS4 that each extend in the second direction Y.

Figure 28:
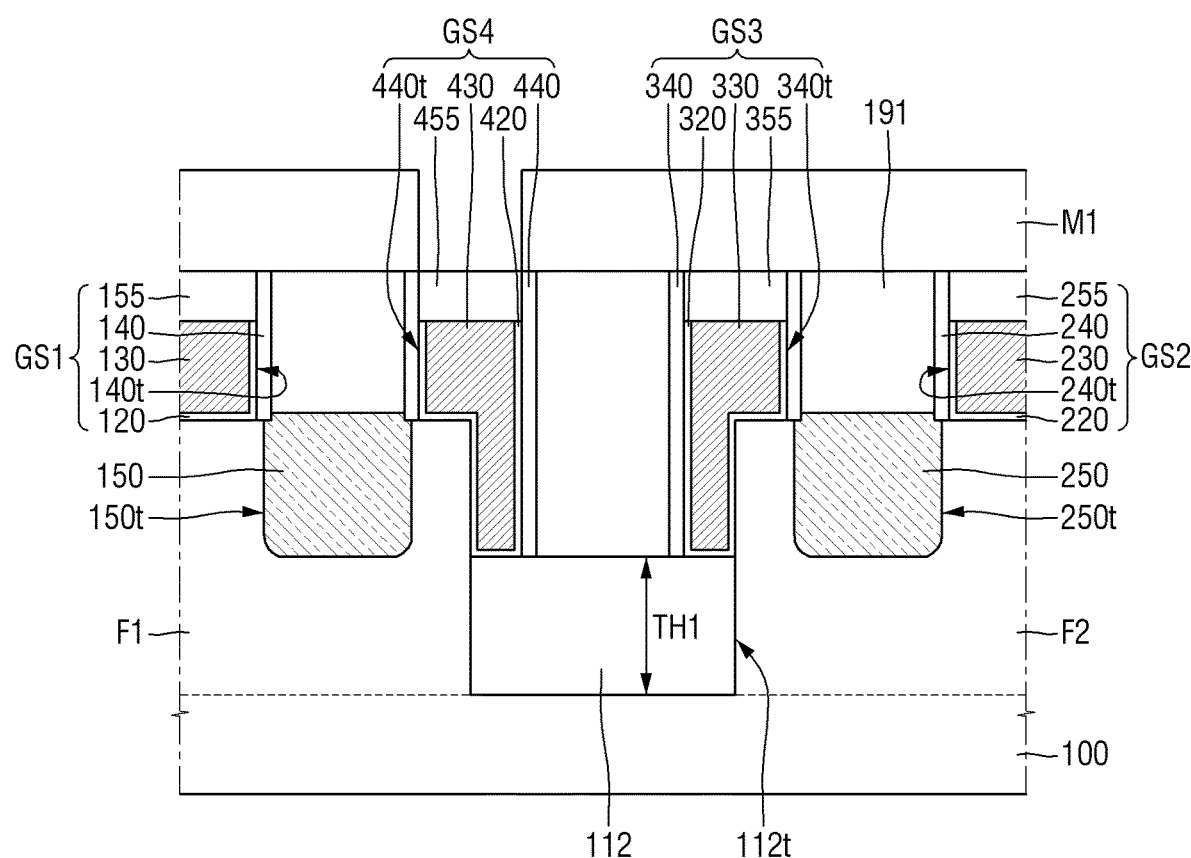

Referring to FIG. 28, a first mask pattern 180 for exposing the fourth gate structure GS4 is formed. For example, the first mask pattern M1 may expose the upper surface of the fourth capping pattern 455. The first mask pattern M1 is illustrated as not exposing the upper surface of the first separation spacer 440, but embodiments of the inventive concept are not limited thereto. For example, the first mask pattern M1 may expose the upper surface of the first isolation spacer 440.

Figure 29:
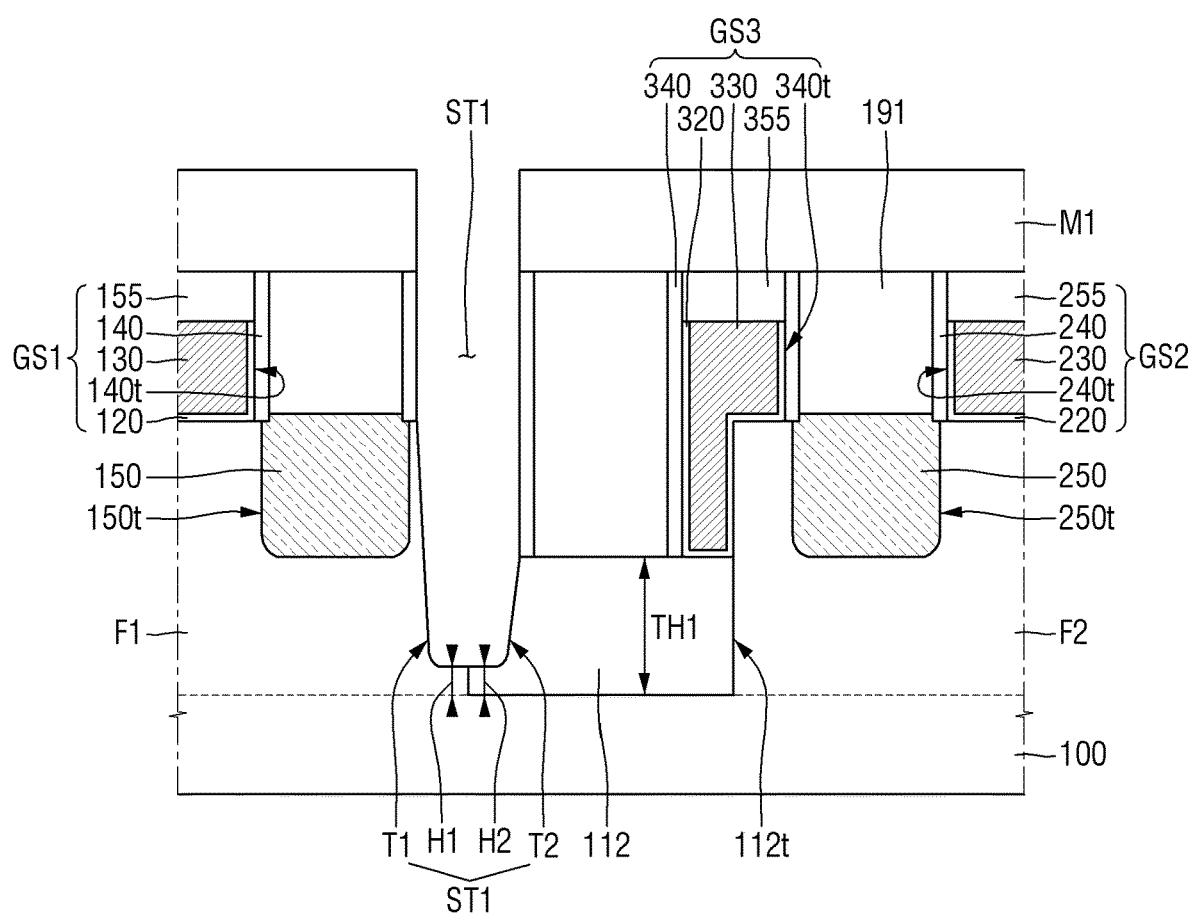

Referring to FIG. 29, the first isolation trench ST1 is formed in the first active pattern F1 and the first field insulating film 112. For example, the fourth capping pattern 455, the fourth gate electrode 430, the fourth gate insulating film 420, the first active pattern F1, and the first field insulating film 112 may be etched, using the first mask pattern M1 as an etching mask, thus forming the first isolation trench ST1 including the first trench T1 in the first active pattern F1 and the second trench T2 in the first field insulating film 112.

The height H1 of the bottom surface of the first trench T1 is illustrated as being the same as the height H2 of the bottom surface of the second trench T2, but this is only for convenience of description, and embodiments of the inventive concept are not limited thereto. For example, the height H1 of the bottom surface of the first trench T1 and the height H2 of the bottom surface of the second trench T2 may be different depending, for example, on the characteristics of the etching process of forming the first isolation trench ST1.

Figure 30:
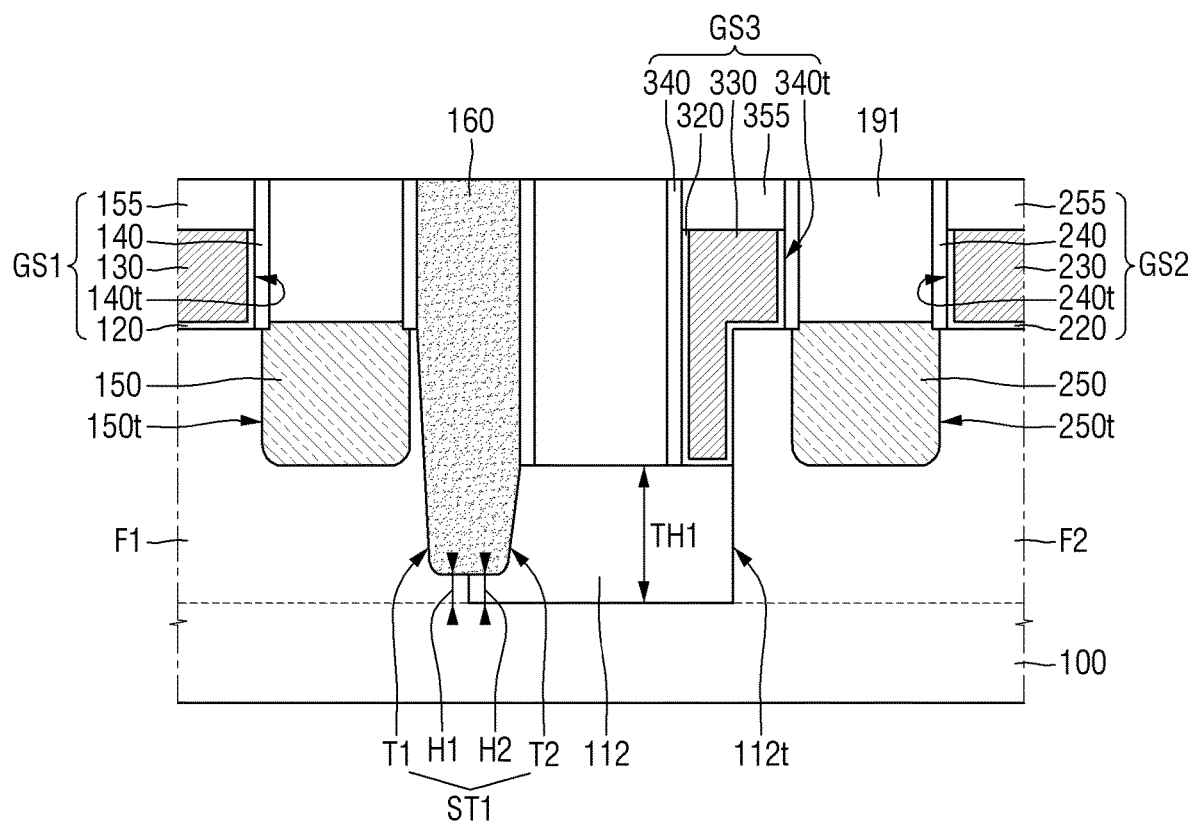

Referring to FIG. 30, an element isolation structure 160 which fills the first isolation trench ST1 is formed. For example, an insulating film which fills the first isolation trench ST1 may be formed. Subsequently, a planarization process may be performed until the upper surfaces of the first to third gate structures GS1, GS2 and GS3 are exposed. As a result, the element isolation structure 160 which crosses between the first active pattern F1 and the first field insulating film 112 may be formed.

Next, referring to FIGS. 1 to 5, the second interlayer insulating film 192 is formed on the first interlayer insulating film 191, the first to third gate structures GS1, GS2 and GS3 and the element isolation structure 160. As a result, the element isolation structure 160 extending from the bottom surface of the first isolation trench ST1 to the bottom surface of the second interlayer insulating film 192 may be formed.

Figure 31:
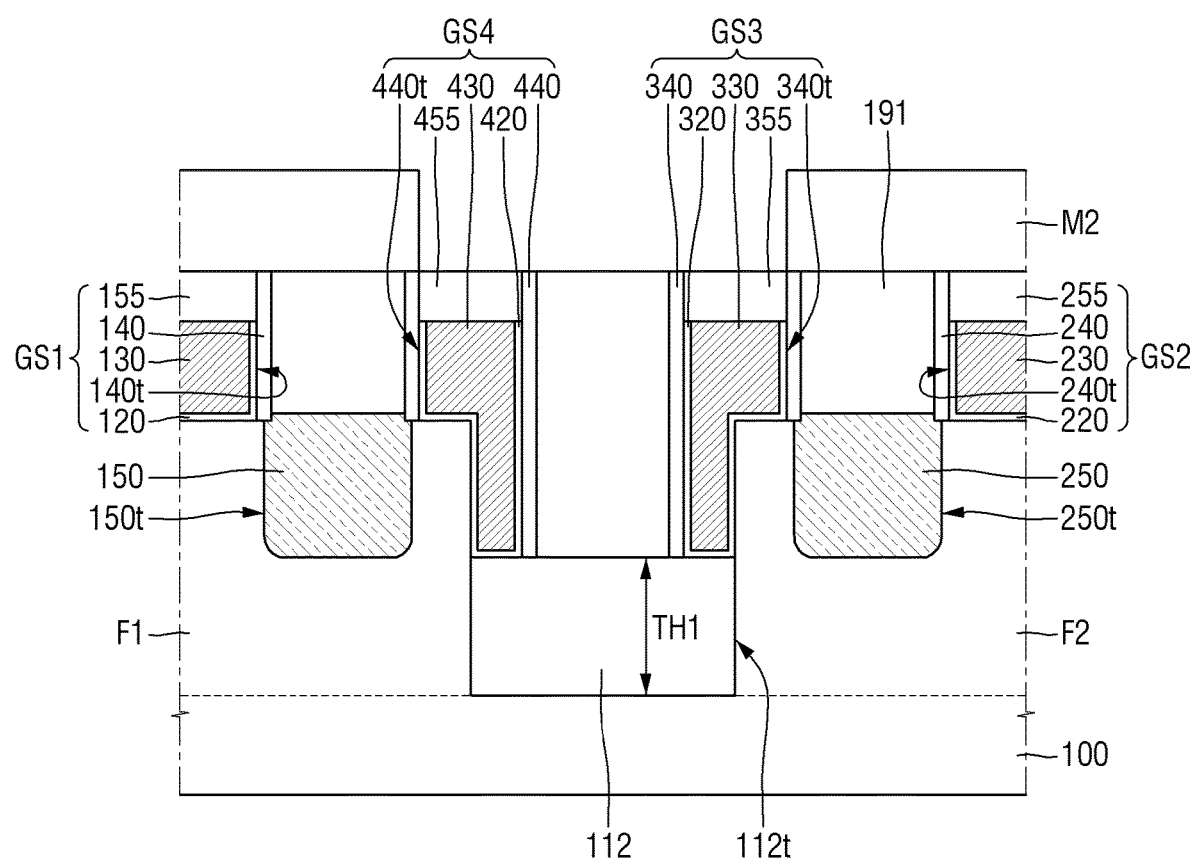
FIGS. 31 to 33 are intermediate step diagrams for explaining a method for fabricating a semiconductor device according to some embodiments of the present inventive concept.
Figure 32:
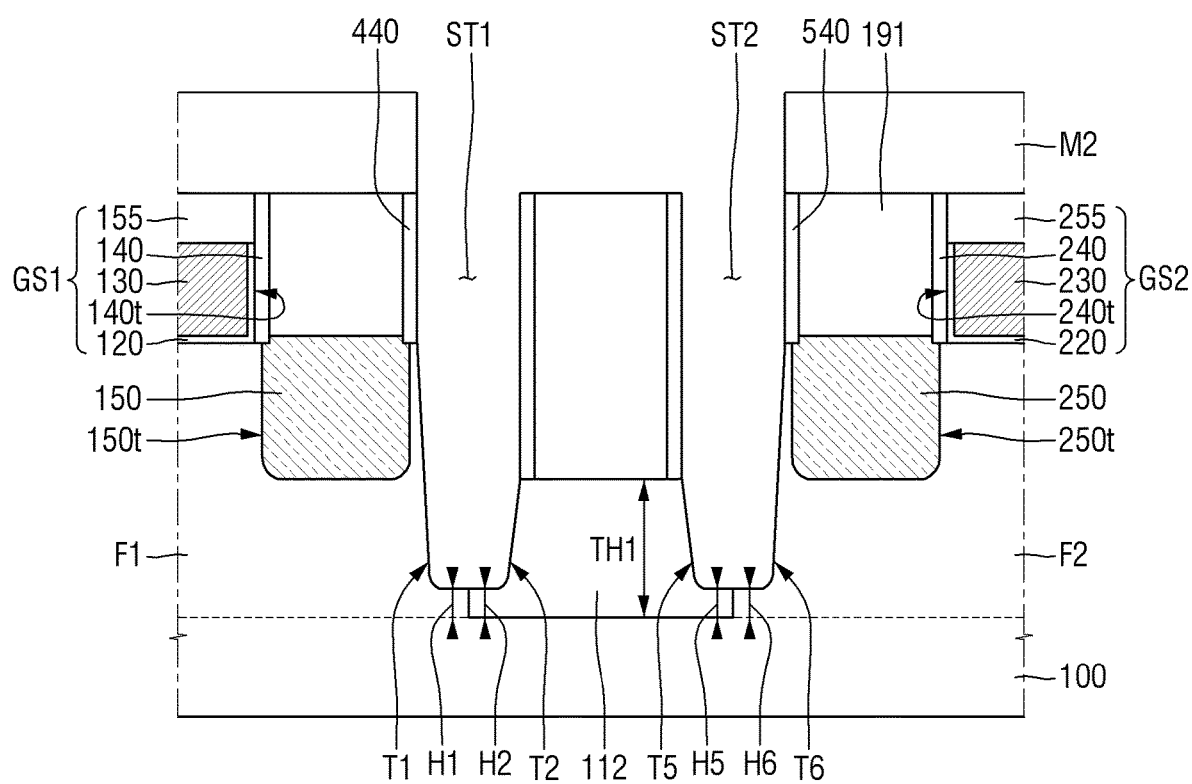
Figure 33:
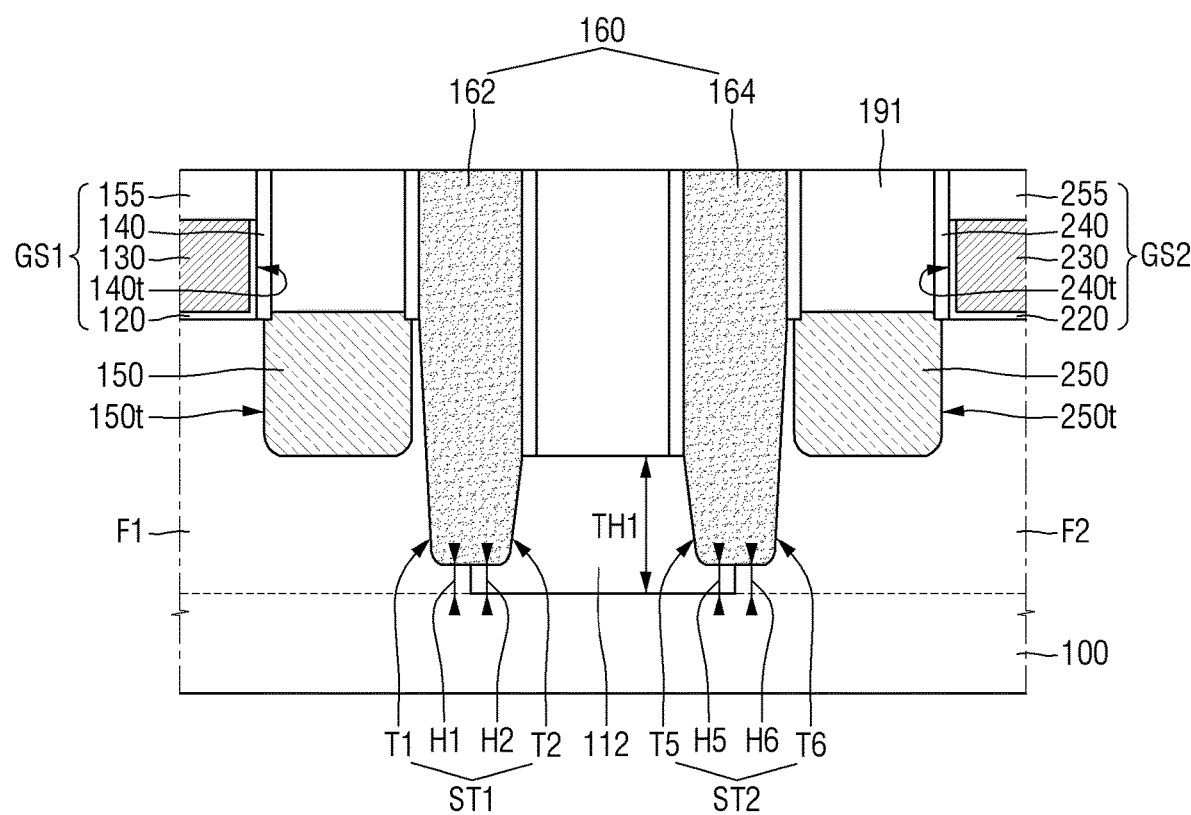

FIGS. 31 to 33 are intermediate step diagrams for explaining a method for fabricating a semiconductor device according to some embodiments of the present inventive concept. For the sake of convenience of explanation, repeated description of items described with reference to FIGS. 1 to 30 may be limited or omitted.

For reference, FIG. 31 is a diagram for explaining the procedures subsequent to FIG. 27. Referring to FIG. 31, a second mask pattern M2 which exposes the third and fourth gate structures GS3 and GS4 is formed. For example, the second mask pattern M2 may expose the upper surfaces of the third and fourth capping patterns 355 and 455. The second mask pattern M2 is illustrated as exposing the first interlayer insulating film 191 between the third gate structure GS3 and the fourth gate structure GS4, but embodiments of the inventive concept are not limited thereto. In some embodiments, the second mask pattern M2 may not expose the first interlayer insulating film 191 between the third gate structure GS3 and the fourth gate structure GS4.

Referring to FIG. 32, the first isolation trench ST1 is formed in the first active pattern F1 and the first field insulating film 112, and the second isolation trench ST2 is formed in the second active pattern F2 and the first field insulating film 112. For example, by using the second mask pattern M2 as an etching mask, the fourth capping pattern 455, the fourth gate electrode 430, the fourth gate insulating film 420, the first active pattern F1, the third capping pattern 355, the third gate electrode 330, the third gate insulating film 320, the second active pattern F2, and the first field insulating film 112 may be etched. In this manner, the first isolation trench ST1 which includes the first trench T1 in the first active pattern F1 and the second trench T2 in the first field insulating film 112 may be formed. Further, the second isolation trench ST2 which includes the sixth trench T6 in the second active pattern F2 and the fifth trench T5 in the first field insulating film 112 may be formed.

In some embodiments, the first interlayer insulating film 191 and/or the first field insulating film 112 between the third gate structure GS3 and the fourth gate structure GS4 may not be etched. However, embodiments of the inventive concept are not limited thereto. Depending on the characteristics of the etching process for forming the first isolation trench ST1 and the second isolation trench ST2, the first interlayer insulating film 191 and/or the first field insulating film 112 between the third gate structure GS3 and the fourth gate structure GS4 may be etched.

Referring to FIG. 33, the element isolation structure 160 which fills the first isolation trench ST1 and the second isolation trench ST2 is formed. For example, the element isolation structure 160 which includes the first isolation region 162 for filling the first isolation trench ST1 and the second isolation region 164 for filling the second isolation trench ST2 may be formed.

Next, referring to FIGS. 13 to 16, the second interlayer insulating film 192 is formed on the first interlayer insulating film 191, the first to third gate structures GS1, GS2 and GS3, and the element isolation structure 160. Thus, the element isolation structure 160 extending from the bottom surfaces of the first isolation trench ST1 and the second isolation trench ST2 to the bottom surface of the second interlayer insulating film 192 may be formed.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
 a first active pattern extending lengthwise along a first direction;
 a second active pattern extending lengthwise along the first direction and spaced apart from the first active pattern in the first direction;
 a field insulating film between the first active pattern and the second active pattern, an upper surface of the field insulating film being lower than or coplanar with upper surfaces of the first and second active patterns; and
 an element isolation structure in an isolation trench in the first active pattern and the field insulating film, wherein an upper surface of the element isolation structure is higher than the upper surfaces of the first and second active patterns.

2. The semiconductor device of claim 1, wherein the element isolation structure extends lengthwise along a second direction which intersects the first direction.

3. The semiconductor device of claim 1, wherein the field insulating film and the element isolation structure comprise different materials.

4. The semiconductor device of claim 1, further comprising a separation spacer extending along side walls of the element isolation structure and disposed on the first active pattern and on the field insulating film.

5. The semiconductor device of claim 1, wherein the isolation trench includes a first portion in the field insulating film and a second portion in the first active pattern, and wherein a height of a bottom surface of the first portion of the isolation trench is different from a height of a bottom surface of the second portion of the isolation trench.

6. The semiconductor device of claim 1, further comprising a gate structure extending in a second direction intersecting the first direction, on the first active pattern.

7. The semiconductor device of claim 6, wherein an upper surface of the gate structure and the upper surface of the element isolation structure are substantially coplanar.

8. The semiconductor device of claim 6, further comprising a source/drain region in the first active pattern between the element isolation structure and the gate structure.

9. The semiconductor device of claim 1, wherein the element isolation structure comprises:
 a first isolation region filling a first isolation trench in the first active pattern and the field insulating film; and
 a second isolation region filling a second isolation trench in the second active pattern and the field insulating film.

10. The semiconductor device of claim 9, wherein the element isolation structure further comprises a connecting isolation region that connects the first isolation region and the second isolation region and that is disposed on the upper surface of the field insulating film.

11. A semiconductor device comprising:
 a first active pattern extending lengthwise along a first direction;
 a second active pattern extending lengthwise along the first direction and spaced apart from the first active pattern along the first direction;
 a third active pattern extending lengthwise along the first direction and spaced apart from the first and second active patterns along a second direction;
 a first field insulating film between the first active pattern and the second active pattern and having an upper surface lower than or coplanar with upper surfaces of the first and second active patterns; and
 an element isolation structure extending lengthwise along the second direction between the first active pattern and the first field insulating film and crossing the third active pattern.

12. The semiconductor device of claim 11, further comprising a second field insulating film between the first active pattern and the third active pattern and having an upper surface lower than the upper surfaces of the first and third active patterns.

13. The semiconductor device of claim 12, wherein the element isolation structure is disposed in a first trench having a first portion in the first active pattern and second portion in the first field insulating film and a second trench having a first portion in the third active pattern and a second portion in the second field insulating film.

14. The semiconductor device of claim 13, wherein a height of a bottom surface of the first portion of the first trench is substantially the same as a height of a bottom surface of the first portion of the second trench and wherein a height of a bottom surface of the second portion of the first trench is substantially the same as a height of a bottom surface of the second portion of the second trench.

15. The semiconductor device of claim 11, wherein the first active pattern and the second active pattern are formed on a NMOS region of a substrate and wherein the third active pattern is formed on a PMOS region of the substrate.

16. The semiconductor device of claim 11, wherein the element isolation structure applies a compressive stress to the third active pattern.

17. A semiconductor device comprising:
- a first active pattern extending lengthwise along a first direction;
- a second active pattern extending lengthwise along the first direction and spaced apart from the first active pattern in the first direction;
- a field insulating film between the first active pattern and the second active pattern and having an upper surface lower than or coplanar with upper surfaces of the first and second active patterns; and
- an element isolation structure in an isolation trench in the first active pattern and the field insulating film and extending lengthwise along second direction intersecting the first direction,
- wherein the field insulating film and the element isolation structure include different materials.

18. The semiconductor device of claim 17, wherein the field insulating film applies a tensile stress to the first active pattern.

19. The semiconductor device of claim 18, wherein the element isolation structure applies a compressive stress to the first active pattern.

20. The semiconductor device of claim 17, wherein the field insulating film comprises silicon oxide and wherein the element isolation structure comprises silicon nitride.

* * * * *